United States Patent [19]
Hirano et al.

[11] Patent Number: 5,953,264
[45] Date of Patent: Sep. 14, 1999

[54] REDUNDANT MEMORY CELL SELECTING CIRCUIT HAVING FUSES COUPLED TO MEMORY CELL GROUP ADDRESS AND MEMORY CELL BLOCK ADDRESS

[75] Inventors: Hiroshige Hirano, Nara; Hisakazu Kotani, Hyogo; Naomi Miyake, Kyoto, all of Japan

[73] Assignee: Matsushita Electric Industrial Co., Ltd., Osaka, Japan

[21] Appl. No.: 08/937,006

[22] Filed: Sep. 24, 1997

Related U.S. Application Data

[63] Continuation of application No. 08/438,919, May 10, 1995, Pat. No. 5,740,114, which is a continuation of application No. 08/035,213, Mar. 22, 1993.

[51] Int. Cl.$^6$ .................................................. G11C 13/00
[52] U.S. Cl. ................ 365/200; 365/230.01; 365/230.06
[58] Field of Search ............................... 365/200, 230.01, 365/230.06, 189.01

[56] References Cited

U.S. PATENT DOCUMENTS 5,317,540   5/1994   Furuyama .......................... 365/230.01

Primary Examiner—Terrell W. Fears
Attorney, Agent, or Firm—McDermott, Will & Emery

[57] ABSTRACT

An apparatus for selecting redundant memory cells in integrated circuit memory devices. The apparatus includes eight memory cell blocks, each of which includes a plurality of memory cell groups, a redundant memory cell group of a first set and a redundant memory cell group of a second set; and eight selecting fuse circuit blocks. Four of the selecting fuse circuit blocks are coupled to the memory cell blocks and adapted to select a redundant word line group of the first set of any of the eight memory cell blocks, and the other four selecting fuse circuit blocks are coupled to the memory cell blocks and adapted to select a redundant word line group of the second set of any of the eight memory cell blocks.

14 Claims, 23 Drawing Sheets

REDUNDANT MEMORY CELL SELECTING CIRCUIT HAVING FUSES COUPLED TO MEMORY CELL GROUP ADDRESS AND MEMORY CELL BLOCK ADDRESS

This is a continuation of application Ser. No. 08/438,919, filed May 10, 1995, now U.S. Pat. No. 5,748,714 which is a continuation of application Ser. No. 08/035,213, filed Mar. 22, 1993.

BACKGROUND OF THE INVENTION

The present invention relates to a redundant memory cell selecting circuit which is designed for a defective memory cell group in a plurality of memory cell groups formed at the points of intersection of word lines and bit lines thereby forming a grid, and is relieved by being replaced with a redundant memory cell group having been previously prepared and connected to a redundant word line group.

Recent trends in the semiconductor memory device (hereinafter referred to as "memory device") industry is emphasizing greater memory device capacity, and as a result, the memory cell groups are arranged in a more integrated manner having higher density. This may cause memory cell groups to become defective in the course of the producing these memory devices. It is a common practice that such defective memory cell groups are replaced with previously prepared redundant memory cell groups by a redundant memory cell selecting circuit. This technique is essential in order to improve the yield.

Therefore, it is important to design a redundant memory cell selecting circuit, previously containing redundant memory cell groups, having numbers which are sufficient to effectively relieve memory cell groups which become defective in the course of their production.

Further, redundant memory cell selecting circuits containing a great number of redundant memory cell groups do not always operate in a normal manner. As such, the inventors of the present invention have proposed, in Japanese Patent Laid-Open Publication No. 63-206999, a redundant memory cell selecting circuit having a function of checking redundant memory cell groups for performance before the replacement of such a defective memory cell group, so as to assure that the defective memory cell group can be replaced with only a redundant memory cell group having favorable qualities.

(First Conventional Example)

The following description will discuss a first conventional redundant memory cell selecting circuit with reference to FIGS. 21 and 22.

FIG. 21 shows a first conventional redundant memory cell selecting circuit, and FIG. 22 shows a redundant-memory-cell-group selecting fuse circuit (hereinafter referred to as "selecting fuse circuit") block FB100. Each of Selecting fuse circuit blocks FB101 to FB115 has an arrangement similar to that of the selecting fuse circuit block FB100.

FIGS. 21 and 22 show: memory cell blocks MC30 to MCB7; the selecting fuse circuit blocks FB100 to FB115; redundant word line groups RWL00, RWL01, RWL10, RWL11, . . . , RWL70, and RWL71; address signals A0 to A8 and /A0 to /A8; signals SPE0, SPE1, R00, R01, R10, R11, R70, R71, /RA, and N01; fuses F00 to F11; a power voltage VCC; a grounding voltage VSS; N-channel MOS transistors QN00 to QN14; and a P-channel MOS transistor QP00.

According to the first conventional example, the redundant memory cell selecting circuit is designed whereby the defective memory cell groups among a plurality of memory cell groups formed at the points of intersection of word lines and bit lines arranged to form a grid, are replaced with redundant memory cell groups which are previously prepared and connected to redundant word line groups.

The redundant memory cell selecting circuit has eight memory cell blocks MCB0 to MCB7 designed to be selected by the logical voltages of address signals A6 to A8.

Each of the memory cell blocks has two redundant word line groups which respectively belong to first and second sets. For example, the memory cell block MCB2 has two redundant word line groups RWL20, RWL21. That is, sixteen total redundant word line groups are prepared for the eight memory cell blocks.

To select these redundant word line groups, sixteen selecting fuse circuit blocks FB100 to FB115 are respectively prepared for the sixteen redundant word line groups. For example, when it is desired to use two redundant word line groups RWL20, RWL21 of the memory cell block MCB2, fuses corresponding to the addresses of defective memory cell groups are disconnected in the selecting fuse circuit blocks FB104, FB105, so as to replace the normal word line groups connected to the defective memory cell groups with the redundant word line groups.

The following description will discuss in detail the operation of the redundant memory cell selecting circuit of the first conventional example with reference to FIG. 22. FIG. 22 shows the selecting fuse circuit block FB100. Each of the selecting fuse circuit blocks FB101 to FB115 has an arrangement similar to that of the selecting fuse circuit block FB100.

First, the logical voltage of a signal /RA becomes "Low (hereinafter referred to L)", the P-channel MOS transistor QP00 is turned on, and the logical voltage of the signal N01 becomes "High (hereinafter referred to H)". Thereafter, the logical voltage of the signal /RA becomes H, and the address signals A0 to A5, /A0 to /A5 of which logical voltages have been initially "L", are converted into address signals corresponding to the address of a defective memory cell group selected. Here, the address signals /A0 to /A5 are the logical-voltage signals of which logics are reverse to those of the address signals A0 to A5, respectively.

The address signals A0 to A5 and /A0 to /A5 are respectively supplied to the gates of twelve N-channel MOS transistors QN00 to QN11, of which half or six transistors are turned on.

At this time, when those six fuses of the fuses F100 to F111 which correspond to the address of a selected defective memory cell group are disconnected and when the memory block selecting address of the memory cell block MCB0 is selected, the logical voltage of the signal N01 becomes "H" and the logical voltage of the signal R00 becomes "L". Then, the logical voltage of the signal SPE0 becomes "H". Next, the redundant word line group RWL00 is selected by a signal of the logical multiplication of the signal SPE0 and the address signals corresponding to the memory cell block selecting address of the memory cell block MCB0.

In the redundant memory cell selecting circuit of the first conventional example having the arrangement above-mentioned, two redundant word line groups are prepared for each of the eight memory cell blocks. Accordingly, sixteen (i.e., 2×8) selecting fuse circuit blocks are required. Since twelve fuses are required for one selecting fuse circuit block, 192 (i.e., 12×16) total fuses are required.

(Second Conventional Example)

The following description will discuss the redundant memory cell selecting circuit of a second conventional example with reference to FIG. 23.

FIG. 23 shows a redundant memory cell testing circuit block 51 in the redundant memory cell selecting circuit of the second conventional example. The redundant memory cell testing circuit block is designed to check the redundant memory cell groups for performance in the redundant memory cell selecting circuit.

FIG. 23 shows: address signals A1, A2 serving as redundant memory cell selecting input signals; a control signal B; a redundant memory cell selecting output signal C; a redundant memory cell testing control signal D; redundant memory cell selecting fuses F1, and F2; P-channel MOS transistors QP1 to QP6; N-channel MOS transistors QN1 to QN7; a redundant memory cell testing circuit block 51; a selecting fuse circuit block 52; a power voltage VCC; and a grounding voltage VSS.

In the redundant memory cell selecting circuit according to the second conventional example, a normal memory cell group is selected when the logical voltage of the redundant memory cell selecting output signal C is "L", and a redundant memory cell group is selected when the logical voltage of the redundant memory cell selecting output signal C is "H".

The following description will discuss the operation of the redundant memory cell selecting circuit according to the second conventional example.

The redundant memory cell testing control signal D is floating, and the P-channel MOS transistor QP2 is turned on. Accordingly, the logical voltage of a signal entered into the gate of the N-channel MOS transistor QN3 becomes "H" to turn on the N-channel MOS transistor QN3, the logical voltage of a signal entered into the gate of the P-channel MOS transistor QP3 becomes "L" to turn off the P-channel MOS transistor QP3, and the logical voltage of a signal entered into the N-channel MOS transistor QN7 becomes "L" to turn off the N-channel MOS transistor QN7. Accordingly, a signal presenting a logical voltage identical with that of a signal at the drain of the P-channel MOS transistor QP1 serves as the redundant memory cell selecting output signal C.

First, the following will discuss the operation of the redundant memory cell selecting circuit when the fuses in the selecting fuse circuit block 52 are disconnected.

When the logical voltage of the control signal B is made "L" as the initial state, the P-channel MOS transistor QP1 is turned on, so that the logical voltage of a signal at the drain of the P-channel MOS transistor QP1 becomes "H". Then, the logical voltage of an address signal selected from the address signals A1, A2 becomes "H".

When the fuses corresponding to a selected address signal are not disconnected under the circumstances mentioned above, the logical voltage of the signal at the drain of the P-channel MOS transistor QP1 becomes "L" and the logical voltage of the redundant memory cell selecting output signal C becomes "L". Accordingly, a memory cell-group is selected.

On the other hand, if the fuses corresponding to a selected address signal are disconnected, the logical voltage of the signal at the drain of the P-channel MOS transistor QP1 becomes "H", and the logical voltage of the redundant memory cell selecting output signal C becomes "H". Accordingly, a redundant memory cell group is selected.

Thus, it is possible to select either a memory cell group or a redundant memory cell group according to the address signal selected.

The following description will discuss the operation of the redundant memory cell selecting circuit for selecting a redundant memory cell group without the fuses in the selecting fuse circuit block 52 disconnected.

The logical voltage of the redundant memory cell testing control signal D is made "L". Next, if the logical voltage of a signal entered into the gate of the N-channel MOS transistor QN3 becomes "L" to turn off the N-channel MOS transistor QN3, then the logical voltage of a signal entered into the gate of the P-channel MOS transistor QP3 becomes "H" to turn off the P-channel MOS transistor QP3, and the logical voltage of a signal entered into the date of the N-channel MOS transistor QN7 becomes "H" to turn on the N-channel MOS transistor QN7. Accordingly, the logical voltage of the redundant memory cell selecting output signal C is always "H". Thus, a redundant memory cell group is selected regardless of whether either address signal A1 or A2 is selected or whether the fuses F1, F2 are connected or disconnected.

In the redundant memory cell selecting circuit of the second conventional example having the above-mentioned arrangement, by setting the logical voltage of the redundant memory cell testing control signal D to "L", a redundant memory cell group can be selected and checked for normal operation without causing the fuses of the selecting fuse circuit block to be disconnected. In fact, an external control terminal is disposed for the redundant memory cell testing control signal D, and the redundant memory cell groups are checked with the use of this external control terminal at the time of a probe test conducted before assembling a memory device.

However, the redundant memory cell selecting circuits of the first and second conventional examples present the following problems.

With regards to the redundant memory cell selecting circuit, according to the first conventional example, a great number of redundant word line groups and a great number of selecting fuse circuit blocks are required for the memory cell blocks. Accordingly, the memory device requires a large layout area, thus increasing the area of the memory device in its entirety. This results in an increase in production costs.

To select one redundant memory cell selecting output signal C, in the redundant memory cell selecting circuit according to the second conventional example, one redundant memory cell testing control signal D is required. Accordingly, an increase in the number of redundant memory cell groups will increase the number of the redundant memory cell testing control signals D for selecting the redundant memory cell groups. When external control terminals are disposed for the redundant memory cell testing control signals D and the redundant memory cell groups are to be checked with the use of the external control terminals while a probe test is conducted before assembling a memory device, the number of the external control terminals is increased so as to increase the memory device in the chip area. Consequently, the cost of producing the memory devices will be increased. Further, a probe testing device is required to have a great number of control terminals for controlling the external control terminals, resulting in the increase in cost of the probe testing device.

SUMMARY OF THE INVENTION

In view of the foregoing, the objective of the present invention is to provide a redundant memory cell selecting circuit which prevents the chip area from being increased, decreases the cost of chip inspection, and can be economically produced with high yield.

To achieve the objective of the present invention, a first redundant memory cell selecting circuit according to the present invention comprises: a plurality of memory cell blocks, each of which includes a plurality of redundant memory cell groups; and a selecting fuse circuit block. The plurality of redundant memory cell groups in each of the plurality of memory cell blocks include one redundant memory cell group which corresponds to the selecting fuse circuit block. Moreover, the selecting fuse circuit block is designed to select the one redundant memory cell group corresponding to the selecting fuse circuit block among a plurality of redundant memory cell groups in any of the memory cell blocks.

According to the above-mentioned arrangement, the number of redundant memory cell groups which can be selected by the selecting fuse circuit block may be greater than the number of selecting fuse circuit blocks. Thus, without the redundant memory cell groups decreased in number, the fuse circuit part normally requiring a greater layout area can be reduced in area, resulting in reduction in the area of the memory device in its entirety. This provides the advantage of producing the memory devices more economically.

According to the present invention, the redundant memory cell selecting circuit may further comprise a second selecting fuse circuit block designed to select any of the plurality of redundant memory cell groups in any of the plurality of memory cell blocks. In such an arrangement, the second selecting fuse circuit-block can select any of all the redundant memory cell groups, thus enhancing the degree of freedom for relief, i.e., replacement, by the redundant memory cell groups.

According to the present invention, the redundant memory cell selecting circuit may be arranged such that the total number of the selecting fuse circuit blocks may be smaller than the total number of the redundant memory cell-groups.

According to the present invention, the redundant memory cell selecting circuit may be arranged such that: each of the plurality of memory cell blocks further include a plurality of memory cell groups; and the selecting fuse circuit block is designed to store any of a plurality of memory cell block selecting addresses which respectively correspond to the plurality of memory cell blocks, and also designed to store any of a plurality of memory cell group selecting addresses which respectively correspond to the plurality of memory cell groups in the memory cell block which corresponds to a memory cell block selecting address stored in the selecting fuse circuit block.

Moreover, the arrangement exists whereby when a memory cell block selecting address and a memory cell group selecting address stored in the selecting fuse circuit block are selected, then the memory cell group which corresponds to the memory cell group selecting address and which belongs to the plurality of memory cell groups in the memory cell block corresponding to the memory cell block selecting address, is designed to be replaced with the one redundant memory cell group which belongs to the plurality of redundant-memory cell groups in the memory cell block corresponding to the memory cell block selecting address and which corresponds to the selecting fuse circuit block.

According to the present invention, the redundant memory cell selecting circuit may be arranged such that each of the plurality of memory cell blocks includes M number of redundant memory cell groups (M is a natural number); the selecting fuse circuit block is disposed in plural numbers; second, third, . . . , M-1th, Mth selecting fuse circuit blocks are further disposed; the total number of the selecting fuse circuit blocks and the second, third, . . . , M-1th, Mth selecting fuse circuit blocks is equal to L (L is a natural number); an Nth selecting fuse circuit block (N is a natural number equal to or greater than 2 and equal to and less than M) which are each of the second, third, . . . , M-1th, Mth selecting fuse circuit blocks, is designed to select any of N redundant memory cell groups which belong to the M redundant memory cell groups in any of the memory cell blocks and which correspond to the Nth selecting fuse circuit block; and the number of the Nth selecting fuse circuit blocks is equal to or less than K (K is a natural number) and which satisfies the following equation:

$$[\{L\times(M-N+1)\}/M]-1 < K \leq \{L\times(M-N+1)\}/M$$

To achieve the above-mentioned objective, a second redundant memory cell selecting circuit according to the present invention comprises: a plurality of memory cell blocks, each of which includes a memory cell group and a redundant memory cell group; and a selecting fuse circuit block. The selecting fuse circuit block is designed to replace the memory cell group in a memory cell block among the plurality of memory cell blocks.

According to the above-mentioned arrangement, without reducing the degree of freedom for the relief by the redundant memory cell groups, the total number of redundant memory cell groups and selecting fuse circuit blocks can be reduced. This reduces the area of the memory device. Further, the efficiency of relief by the redundant memory cell groups can be improved. This advantageously produces the effect that the memory device can be produced more economically.

To achieve the above-mentioned objective, a third redundant memory cell selecting circuit according to the present invention comprises: a plurality of memory cell blocks, each of which includes a memory cell group; a dedicated redundant memory cell block including a redundant memory cell group only; and a selecting fuse circuit block designed to replace the memory cell group in any of the plurality of memory cell blocks, with the redundant memory cell group in the dedicated redundant memory cell block.

To achieve the above-mentioned objective, a fourth redundant memory cell selecting circuit according to the present invention comprises: a plurality of first memory cell blocks each of which includes a memory cell group; a second memory cell block including a memory cell group; and a selecting fuse-circuit block designed to replace any of the plurality of first memory cell blocks with the second memory cell block.

According to the above-mentioned arrangement, a defective memory cell block can be wholly replaced with the second memory cell block.

According to the present invention, the redundant memory cell selecting circuit may further comprise a second selecting fuse circuit block and may be arranged such that each of the first and second memory cell blocks further comprise a redundant memory cell group; and the second selecting fuse circuit block is added to replace the memory cell group in a memory cell block out of the first and second memory cell blocks, with the redundant memory cell group in the memory cell block mentioned above.

According to the present invention, the redundant memory cell selecting circuit may further comprise a second selecting fuse circuit block designed to select, as a redundant memory cell group, the memory cell group in any of the first memory cell blocks which is replaced with the second memory cell block.

According to the present invention, the redundant memory cell selecting circuit may be arranged such that: each of the plurality of first memory cell blocks further has a bit line and a word line; and provision is made such that the bit line and the word line of any of the first memory cell blocks which is replaced with the second memory cell block, presents the same potential.

To achieve the above-mentioned objective, a fifth redundant memory cell selecting circuit according to the present invention comprises: a plurality of memory cell groups; a plurality of redundant memory cell groups; and a selecting fuse circuit block designed to store one of a plurality of memory cell group selecting addresses corresponding, respectively, to the plurality of memory cell groups. The selecting fuse circuit block is designed to: replace the memory cell group corresponding to the memory cell group selecting address thus stored, with any one of the plurality of redundant memory cell groups; and cancel the stored memory cell group selecting address.

According to the above-mentioned arrangement, when the redundant memory cell group which has been replaced is found defective, the memory cell group selecting address once stored in the selecting fuse circuit block can be cancelled, and the defective memory cell group can be replaced with another redundant memory cell group by another selecting fuse circuit block. This greatly improves the efficiency of relief by the redundant memory cell groups.

To achieve the above-mentioned objective, a sixth redundant memory cell selecting circuit according to the present invention comprises: a plurality of redundant memory cell groups; a plurality of selecting fuse circuit blocks in the same number as that of the plurality of redundant memory cell groups; and a redundant memory cell testing circuit block connected to each of the plurality of selecting fuse circuit blocks. The redundant memory cell testing circuit block being designed to: receive a plurality of output signals of the plurality of selecting fuse circuit blocks; a plurality of address signals; a redundant memory cell testing control signal; and supply a plurality of redundant memory cell selecting output signals respectively corresponding to the plurality of redundant memory cell groups. The plurality of address signals are designed to cause each of the plurality of redundant memory cell selecting output signals to be put in a true state when the redundant memory cell testing control signal is put in a true state. Each of the plurality of redundant memory cell groups are designed to be selected when the redundant memory cell selecting output signal corresponding to each of the plurality of redundant memory cell groups is put in the true state.

With the above-mentioned arrangement, in the redundant memory cell selecting circuit having the redundant memory cell testing circuit block for checking the redundant memory cell groups for performance, the plurality of redundant memory cell selecting output signals can be selected by a combination of one redundant memory cell testing control signal with the address signals. Accordingly, one external control terminal for the redundant memory cell testing control signal can select and inspect all the redundant memory cell groups. It is therefore possible to provide a redundant memory cell selecting circuit which restrains the memory device from being increased in chip area, which reduces the cost of a probe inspecting device, and which can be economically produced with high yield.

To achieve the above-mentioned objective, a seventh redundant memory cell selecting circuit according to the present invention comprises: a first redundant memory cell group unit comprising a plurality of first redundant memory cell groups arranged in a line direction; a second redundant memory cell group unit comprising a plurality of second redundant memory cell groups arranged in a row direction; a plurality of selecting fuse circuit blocks in the same number as the total number of the plurality of first redundant memory cell groups and the plurality of second redundant memory cell groups; and a redundant memory cell testing circuit block connected to each of the plurality of selecting fuse circuit blocks. The redundant memory cell testing circuit block is designed to receive: a plurality of output signals from the plurality of selecting fuse circuit blocks; an address signal; and a redundant memory cell testing control signal. The redundant memory cell testing circuit block is designed to: supply a plurality of redundant memory cell selecting output signals corresponding, respectively, to the plurality of first and second redundant memory cell groups; and the first redundant memory cell group unit or the second redundant memory cell group unit which are designed to be selected by the address signal.

To achieve the above-mentioned objective, an eighth redundant memory cell selecting circuit comprises: a plurality of redundant memory cell groups; a plurality of selecting fuse circuit blocks in the same number as that of the plurality of redundant memory cell groups; a redundant memory cell testing circuit block connected to each of the plurality of selecting fuse circuit blocks; and a testing control signal generating circuit block. The testing control signal generating circuit block is designed to receive an external input signal and a mode switching control signal, and designed to supply a plurality of mode control signals and a redundant memory cell testing control signal. The redundant memory cell testing control signal is designed to be put in a true state by a combination of the logical voltage of the mode switching control signal at the point where the external input signal rises up, with the logical voltage of the mode switching control signal at the point where the external input signal falls down. The redundant memory cell testing circuit block is designed to receive a plurality of output signals of the plurality of selecting fuse circuit blocks and a plurality of address signals and a redundant memory cell testing control signal from the testing control signal generating circuit block. The redundant memory cell testing circuit block is designed to supply a plurality of redundant memory cell selecting output signals corresponding, respectively, to the plurality of redundant memory cell groups. The plurality of address signals is designed to cause each of the plurality of redundant memory cell selecting output signals to be put in a true state when the redundant memory cell testing control signal is put in a true state. Each of the plurality of redundant memory cell groups is designed to be selected when the redundant memory cell selecting output signal, corresponding to the each of the redundant memory cell groups, is put in the true state.

With the above-mentioned arrangement, the testing control signal generating circuit block is designed to make a choice of three modes, for example, two modes of control signals and one redundant memory cell testing control signal. Thus, three modes can be switched with one mode switching control signal so that all the redundant memory cell groups can be inspected by a relatively small number of external control terminals. This enables the chip area of the memory device to be reduced and advantageously reduces the cost of a probe inspecting device.

DETAILED DESCRIPTION OF THE INVENTION (First Embodiment)

Figure 1:
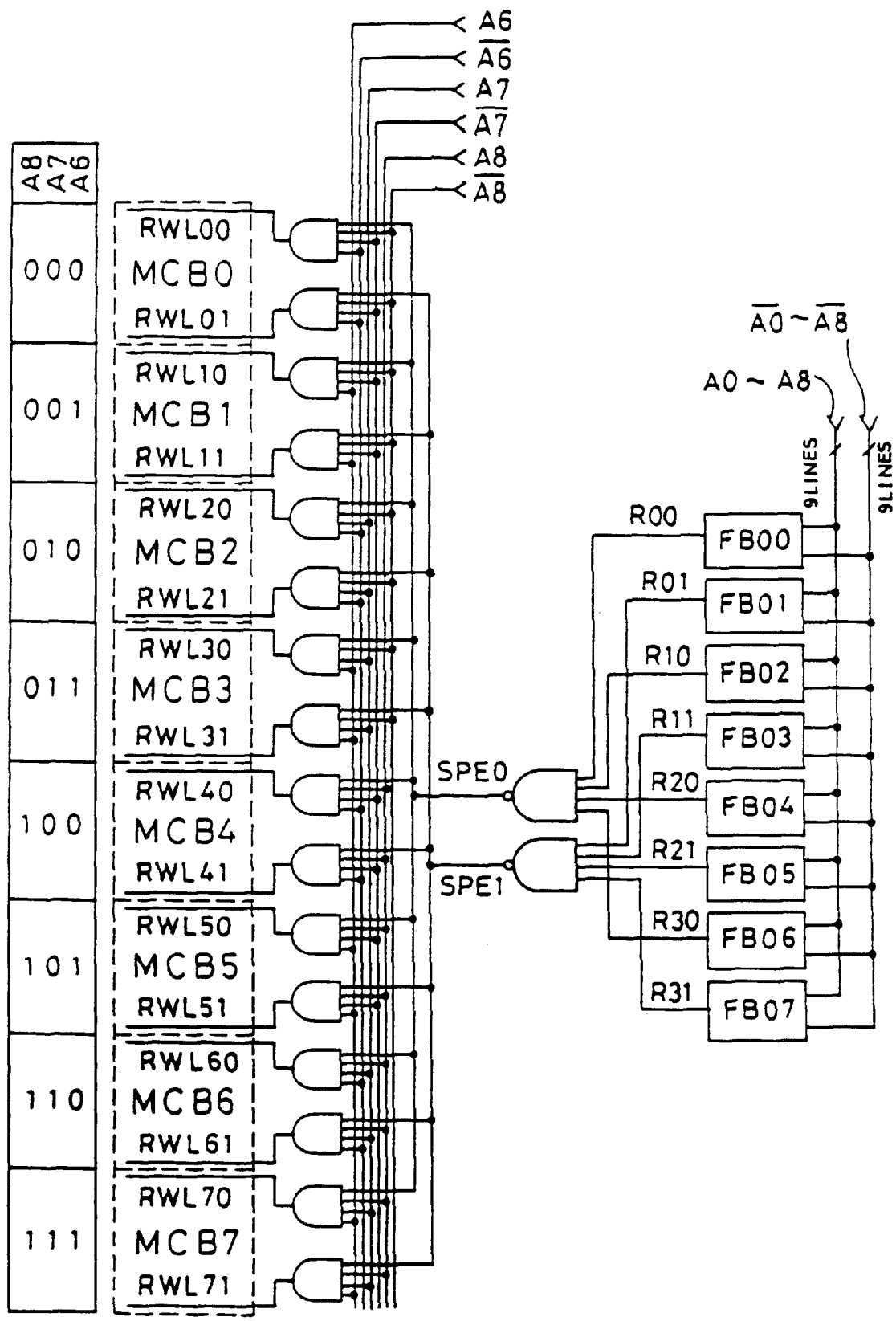
FIG. 1 is a block diagram of the redundant memory cell selecting circuit according to a first embodiment of the present invention.
Figure 2:
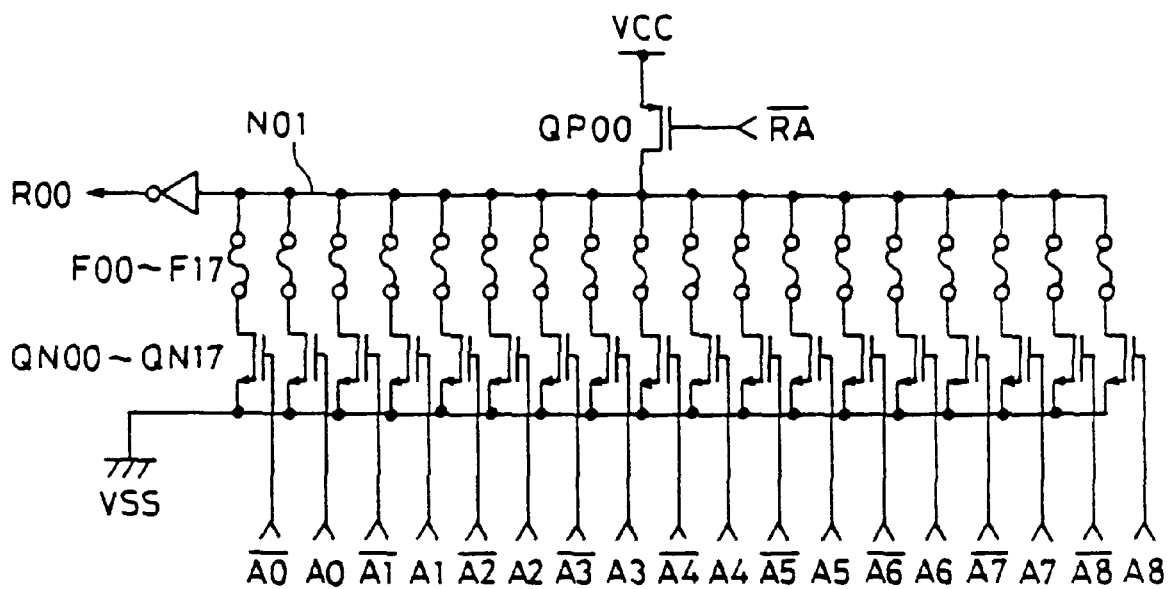
FIG. 2 is a circuit diagram of a selecting fuse circuit block in the redundant memory cell selecting circuit according to the first embodiment of the present invention.

The following description will discuss the redundant memory cell selecting circuit according to a first embodiment of the present invention with reference to FIGS. 1 and 2.

FIG. 1 shows the redundant memory cell selecting circuit according to the first embodiment, and FIG. 2 shows a selecting fuse circuit block FB00 in FIG. 1. Each of selecting fuse circuit blocks FB01 to FB07 has an arrangement similar to that of the selecting fuse circuit block FB00.

FIGS. 1 and 2 show: memory cell blocks MCB0 to MCB7; the selecting fuse circuit blocks FB00 to FB07; redundant word line groups RWL00, RWL01, RWL10, RWL11, . . . , RWL70, and RWL71; address signals A0 to A8 and /A0 to /A8; signals SPE0, SPE1, R00, R01, R10, R11, . . . , R30, R31, /RA, and N01; fuses F00 to F17; a power voltage VCC; a grounding voltage VSS; N-channel MOS transistors QN00 to QN17; and a P-channel MOS transistor QP00.

Similar to the first conventional example, the redundant memory cell selecting circuit according to the first embodiment is designed whereby the defective memory cell groups in a plurality of memory cell groups formed at the points of the intersection of word lines and bit lines arranged in a grid manner, are relieved when replaced with redundant memory cell groups. These redundant memory cell groups were previously prepared as being connected, respectively, to the redundant word line groups.

The redundant memory cell selecting circuit has eight memory cell blocks MCB0 to MCB7 (hereinafter the memory cell blocks are collectively referred to as "MCB") designed to be selected by the logical voltages of address signals A6 to A8. The redundant word line groups RWL00 to RWL71 (hereinafter the redundant word line groups are collectively referred to as "RWL") are prepared for the memory cell blocks MCB0 to MCB7. Each memory cell block has two redundant word line groups which respectively belong to first and second sets. For example, the memory cell block MCB 2 has two redundant word line groups RWL20 and RWL21. That is, sixteen total redundant word line groups RWL are prepared for the eight memory cell blocks. To select sixteen redundant word line groups RWL, eight selecting fuse circuit blocks FB00 to FB07 are respectively prepared. For example, when it is desired to use the redundant word line group RWL20 of the first set and the redundant word line group RWL21 of the second set in the memory cell block MCB2, fuses corresponding to the addresses of defective memory cell groups, are disconnected in the selecting fuse circuit blocks FB00 and FB01. This replaces the normal word line groups connected to the defective memory cell groups with the redundant word line groups, thus causing the redundant word line groups to be used.

When there is used one of those redundant word line groups RWL00, RWL10, RWL20, . . . , RWL60 and RWL70 of one of the memory cell blocks which belong to the first set, there is used one of the selecting fuse circuit blocks FB00, FB02, FB04, FB06. When there is used one of those redundant word line groups RWL01, RWL11, RWL21, . . . , RWL61 and RWL71 of one of the memory cell blocks which belong to the second set, there is used one of the selecting fuse circuit blocks FB01, FB03, FB05, FB07.

Four selecting fuse circuit blocks are prepared for eight redundant word line groups of the first set, and four selecting fuse circuit blocks are prepared for eight redundant word line groups of the second set.

Generally, memory cell groups often become defective because a plurality of word line groups in one memory cell block become defective. It is rare for a plurality of word line groups in all the memory cell blocks MCB to become defective. The number of defective word line groups in one memory device is at most eight. Accordingly, it is not required to prepare eight selecting fuse circuit blocks for eight redundant word line groups of the first set and eight selecting fuse circuit blocks for eight redundant word line groups of the second set, i.e., to prepare sixteen total selecting fuse circuit blocks, as done in the first conventional example. In the first embodiment, by preparing merely eight selecting fuse circuit blocks, defective memory cell groups can be relieved when replaced with redundant memory cell groups.

Likewise in the first conventional example, the number of the redundant word line groups prepared for each memory cell block is two. However, the total number of the redundant word line groups which can be used is limited to eight, rather than sixteen. This reduces the number of the selecting fuse circuit blocks without the efficiency of relief provided by the redundant memory cell groups lowered.

The following description will discuss in detail the operation of the redundant memory cell selecting circuit according to the first embodiment with reference to FIG. 2. FIG. 2 shows the selecting fuse circuit block FB00. Each of the selecting fuse circuit blocks FB01 to FB07 has an arrangement similar to that of the selecting fuse circuit block FB00.

In FIG. 2, the logical voltage of the signal /RA first becomes "L" to turn on the P-channel MOS transistor QP00, and then the logical voltage of the signal N01 becomes "H". Thereafter, the logical voltage of the signal /RA becomes "H", and the address signals A0 to A8 and /A0 to /A8 of which logical voltages have been initially "L", are then converted into address signals corresponding to the address of a selected defective memory cell group. Here, the address signals /A0 to /A8 are the logical-voltage signals of which logics are reverse to those of the address signals A0 to A8.

The address signals A0 to A8, and /A0 to /A8 are entered, respectively, into the gates of eighteen N-channel MOS transistors QN00 to QN17, of which half or nine transistors are turned on.

At this time, when those six fuses out of the fuses F00 to F11 which correspond to the address of the selected defective memory cell group, are disconnected and when those three fuses out of the fuses F12 to F17 which correspond to a memory cell block selecting address, are disconnected, the logical voltage of the signal N01 becomes "H", and the logical voltage of the signal R00 becomes "L". Next, the logical voltage of the signal SPE0 becomes "H". Finally, the redundant word line group of the first set is selected by a signal of the logical multiplication of the signal SPE0 and the address signals corresponding to the memory cell block selecting address.

The difference between the first embodiment and the first conventional example resides in the fact that the selecting fuse circuit blocks in the first embodiment contain additional fuses for memory cell block selecting addresses.

In the redundant memory cell selecting circuit of the first embodiment having the above-mentioned arrangement, two redundant word line groups are prepared for each of the eight memory cell blocks. Four selecting fuse circuit blocks are prepared for each of these two redundant word line groups. That is, eight (2×4=8) selecting fuse circuit blocks are disposed. Since eighteen fuses are required for each selecting fuse circuit block, there are disposed 144 (i.e., 18×8=144) total fuses, resulting in 75% reduction as compared with 192 fuses in the first conventional example.

The redundant memory cell selecting circuit according to the first embodiment is characterized in that the number of the redundant word line groups is not reduced. More specifically, without a substantial decrease in the efficiency of relief by the redundant memory cell groups, it is possible to select the redundant memory cell groups by the selecting fuse circuit blocks, whereby the number of fuse circuit blocks is smaller than the number of the prepared redundant memory cell groups. This enables the total area of the selecting fuse circuit blocks.

(Second Embodiment)

Figure 3:
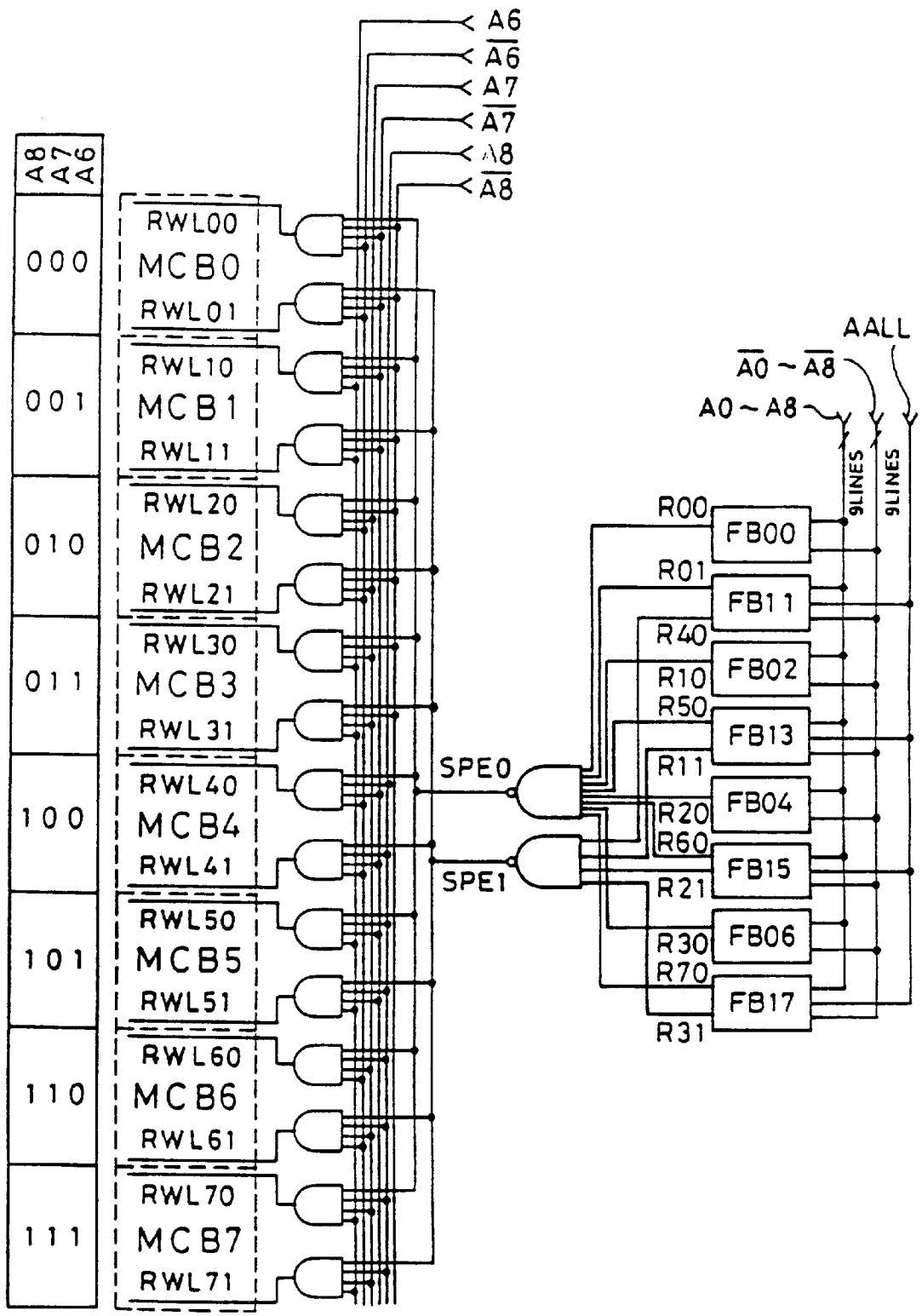
FIG. 3 is a block diagram of the redundant memory cell selecting circuit according to a second embodiment of the present invention.
Figure 4:
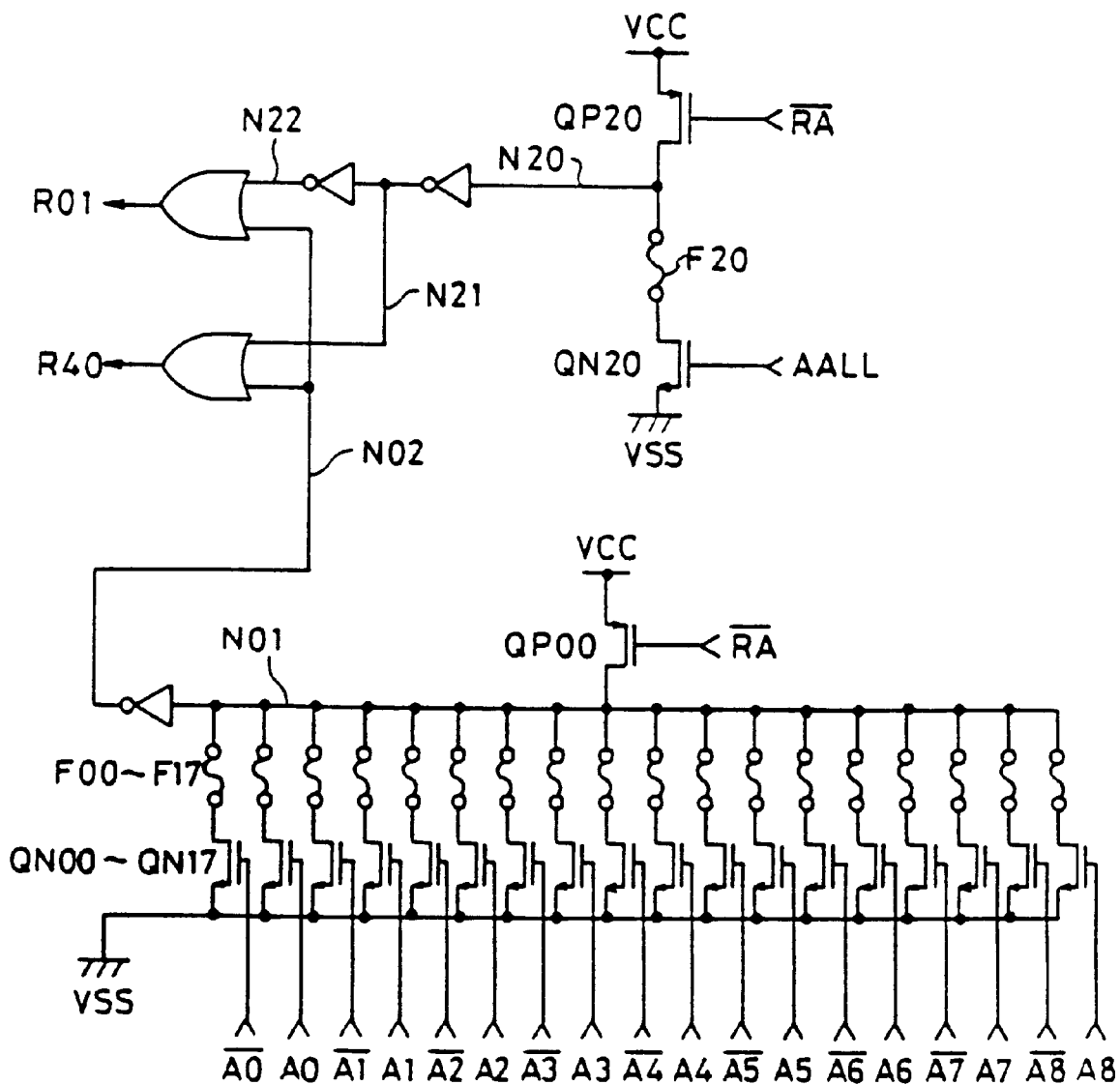
FIG. 4 is a circuit diagram of a selecting fuse circuit block in the redundant memory cell selecting circuit according to the second embodiment of the present invention.

The following description will discuss the redundant memory cell selecting circuit according to a second embodiment of the present invention with reference to FIGS. 3 and 4.

FIG. 3 shows the redundant memory cell selecting circuit according to the second embodiment, and FIG. 4 shows a selecting fuse circuit block FB11 in FIG. 4. Each of selecting fuse circuit blocks FB13, FB15, FB17 has an arrangement similar to that of the selecting fuse circuit block FB11.

FIGS. 3 and 4 show: memory cell blocks MCB0 to MCB7; the selecting fuse circuit blocks FB00, FB02, FB04, FB06, FB11, FB13, FB15, and FB17; redundant word line groups RWL00, RWL01, RWL10, RWL11 . . . RWL70, and RWL71; address signals A0 to A8 and /A0 to /A8; signals SPE0 SPE1, R00, R01, R10, R11, R20, R21, R30, R31, R40, R50, R60, R70, AALL, /RA, N01, N02, N20, N21, N22; fuses F00 to F17 and F20; a power voltage VCC; a grounding voltage VSS; N-channel MOS transistors QN00 to QN17 and QN20; and P-channel MOS transistors QP00 and QP20.

Each of the selecting fuse circuit blocks FB00, FB02, FB04, FB06 has an arrangement similar to that of the selecting fuse circuit block in the redundant memory cell selecting circuit according to the first embodiment shown in FIG. 2.

Similar to the first conventional example, the redundant memory cell selecting circuit according to the second embodiment is designed whereby the defective memory cell groups in a plurality of memory cell groups formed at the points of intersection of word lines and bit lines arranged in a grid manner, are relieved by being replaced with redundant memory cell groups that were previously prepared as being connected, respectively, to redundant word line groups.

The redundant memory cell selecting circuit has eight memory cell blocks MCB0 to MCB7 designed to be selected by the logical voltages of address signals A6 to A8. Two redundant word line groups are prepared for each memory cell block. For example, the memory cell block MCB2 has two redundant word line groups RWL20, RWL21 which respectively belong to first and second sets. That is, sixteen total redundant word line groups RWL are prepared for the eight memory cell blocks. To select sixteen redundant word line groups RWL, eight selecting fuse circuit blocks FB00, FB02, FB04, FB06, FB11, FB13, FB15, FB17 are prepared. For example, when it is desired to use the two redundant word line groups RWL20, RWL21 of the memory cell block MCB2, fuses corresponding to the addresses of defective memory cell groups, are disconnected in the selecting fuse circuit blocks FB00 and FB11. This replaces the normal word line groups connected to the defective memory cell groups with the redundant word line groups, thus causing the redundant word line groups to be used. When one of the redundant word line groups (RWL00, RWL10, RWL20, . . . , RWL60 and RWL70) are used of one of the memory cell blocks which belong to the first set, then one of the selecting fuse circuit blocks (FB00, FB02, FB04, FB06, FB11, FB13, FB15, FB17). When one of those redundant word line groups (RWL01, RWL11, RWL21, RWL61, RWL71) are used of one of the memory cell blocks which belong to the second set, then one of the selecting fuse circuit blocks (FB11, FB13, FB15, FB17) are used. To select one of the redundant word line groups of the first set, all eight of the selecting fuse circuit blocks can be used. To select one of the redundant word line groups of the second set, four selecting fuse circuit blocks can be used, designated out of the eight selecting fuse circuit blocks.

As also discussed in connection with the first embodiment, memory cell groups often become defective because a plurality of word line groups in one memory-cell block become defective. It is rare for a plurality of word line groups in all the memory cell blocks MCB to become defective. Accordingly, even though the total number of the selecting fuse circuit blocks is less than the total number of the redundant word line groups RWL, the efficiency of relief by the redundant memory cell block is not decreased.

As compared with the first embodiment, the second embodiment is arranged such that all eight of the selecting fuse circuit blocks can be used for selecting each of the redundant word line groups of the first set.

The following description will discuss in detail the operation of the redundant memory cell selecting circuit according to the second embodiment with reference to FIG. 4. FIG. 4 shows the selecting fuse circuit block FB11. Each of the selecting fuse circuit blocks FB13, FB15, FB17 has an arrangement similar to that of the selecting fuse circuit block FB11.

In FIG. 4, the logical voltage of the signal /RA first becomes "L" to turn on the P-channel MOS transistor QP00, and the logical voltage of the signal N01 becomes "H". Thereafter, the logical voltage of the signal /RA becomes "H", and the address signals A0 to A8, and /A0 to /A8 of which logical voltages have been initially "L", are converted into address signals corresponding to the address of a selected defective memory cell group. Here, the address signals /A0 to /A8 are the logical-voltage signals of which logics are reverse from those of the address signals A0 to A8.

The address signals A0 to A8, and /A0 to /A8 are respectively entered into the gates of eighteen N-channel MOS transistors QN00 to QN17, of which half or nine transistors are turned on.

At such time, when six fuses of the F00 to F11 fuses corresponding to the address of the selected defective memory cell group are disconnected and when three fuses of the F12 to F17 fuses corresponding to a memory cell block selecting address are disconnected, the logical voltage of the signal N01 becomes "H" and the logical voltage of the signal N02 becomes "L".

In a circuit for determining which redundant word line groups of the first or second set are to be selected, the logical voltage of the signal /RA first becomes "L" to turn on the P-channel MOS transistor QP20, and then the logical voltage of the signal N20 becomes "H". Thereafter, the logical voltage of the signal /RA becomes "H" and the signal AALL, of which logical voltage has been initially "L", becomes "H". This causes the N-channel MOS transistor QN20 to be turned on.

At the instance when the fuse F20 is not disconnected, the logical voltage of the signal N20 becomes "L". Accordingly, the logical voltage of the signal N21 becomes "H", the logical voltage of the signal N22 becomes "L", the logical voltage of the signal R01 becomes "L" and the logical voltage of the signal R40 becomes "H". Accordingly, the logical voltage of the signal SPE0 becomes "H". Through a signal of the logical multiplication of the signal SPE0 and the address signals corresponding to the memory cell block selecting address, the redundant word line group of the first set is selected.

On the other hand, when the fuse F20 is disconnected, the logical voltage of the signal N20 remains "H", the logical voltage of the signal N21 becomes "L" and the logical voltage of the signal N22 becomes "H". Accordingly, the logical voltage of the signal R01 becomes "H", the logical voltage of the signal R40 becomes "L" and the logical voltage of the signal SPE1 becomes "H". Through a signal of the logical multiplication of the signal SPE1 and the address signals corresponding to the memory cell block selecting address, the redundant word line group of the second set is selected.

In the redundant memory cell selecting circuit of the second embodiment having the above mentioned arrangement, two redundant word line groups are prepared for each of the eight memory cell blocks MCB. The redundant memory cell selecting circuit has four selecting fuse circuit blocks which can select the redundant word line groups from only the first set, as well as four other selecting fuse circuit blocks which can select the redundant word line groups from both the first and second sets. For each of the selecting fuse circuit blocks which can select the redundant word line groups of only the first set, eighteen fuses are required. For each of the selecting fuse circuit blocks which can select the redundant word line groups of both the first and second sets, nineteen fuses are required. Accordingly, the total number of the fuses in the redundant memory cell selecting circuit is 148 (i.e., 18×4+19×4=148), resulting in a 77% reduction as compared with 192 fuses in the first conventional example.

For instances in each of the memory cell blocks where the redundant word line groups of the first set is used prior to the redundant word line groups of the second set, then the number of the selecting fuse circuit blocks which can select the redundant word line groups of both the first and second sets, may be smaller than the number of the selecting fuse circuit blocks which can select the redundant word line groups of only the first set.

For example, if the total number of the selecting fuse circuit blocks is 24, then the number of sets to which the redundant memory cell groups in each memory cell block respectively belong will be 4. When selecting any of the redundant memory cell groups of the third set, the redundant memory cell groups of the first and second sets have already been selected and used. Accordingly, the number of the selecting fuse circuit blocks which can select any of the redundant memory cell groups of the first, second and third sets in each memory cell block, may be equal to or less than half of the number of selecting fuse circuit blocks which can select any of the redundant memory cell groups of the first and second sets in each memory cell block.

In view of the foregoing, the number of the selecting fuse circuit blocks which can select any of the redundant memory cell groups of the first, second and third sets in each memory cell block, may be equal to or less than 12 (i.e., 24×(4−3+1)/4=12).

The foregoing may be generally expressed in the following manner. In instances that the number of the selecting fuse circuit blocks is equal to L (L is a natural number), and the number of sets to which the redundant memory cell groups in each memory cell block respectively belong is equal to M (M is a natural number), then the number of the selecting fuse circuit blocks which can select any of the redundant memory cell groups from the first set to the Nth set (N is a natural number greater than 2 and smaller than M) may be equal to or smaller than L×(M−N+1)/M.

Similar to the first embodiment, the redundant memory cell selecting circuit according to the second embodiment is characterized in that it is possible to select the redundant memory cell groups by the selecting fuse circuit blocks having a number which is less than the number of the prepared redundant memory cell groups, without reduction in the number of the redundant memory cell groups, i.e., without substantial decrease in the efficiency of relief by the redundant memory cell groups. Further, the selecting fuse circuit-blocks total area can be reduced. As compared with the first embodiment, the second embodiment is arranged such that all eight selecting fuse circuit blocks can be used for selecting any of the redundant word line groups of the first set. Therefore, increasing the degree of freedom for relief by the redundant memory cell groups.

(Third Embodiment)

Figure 5:
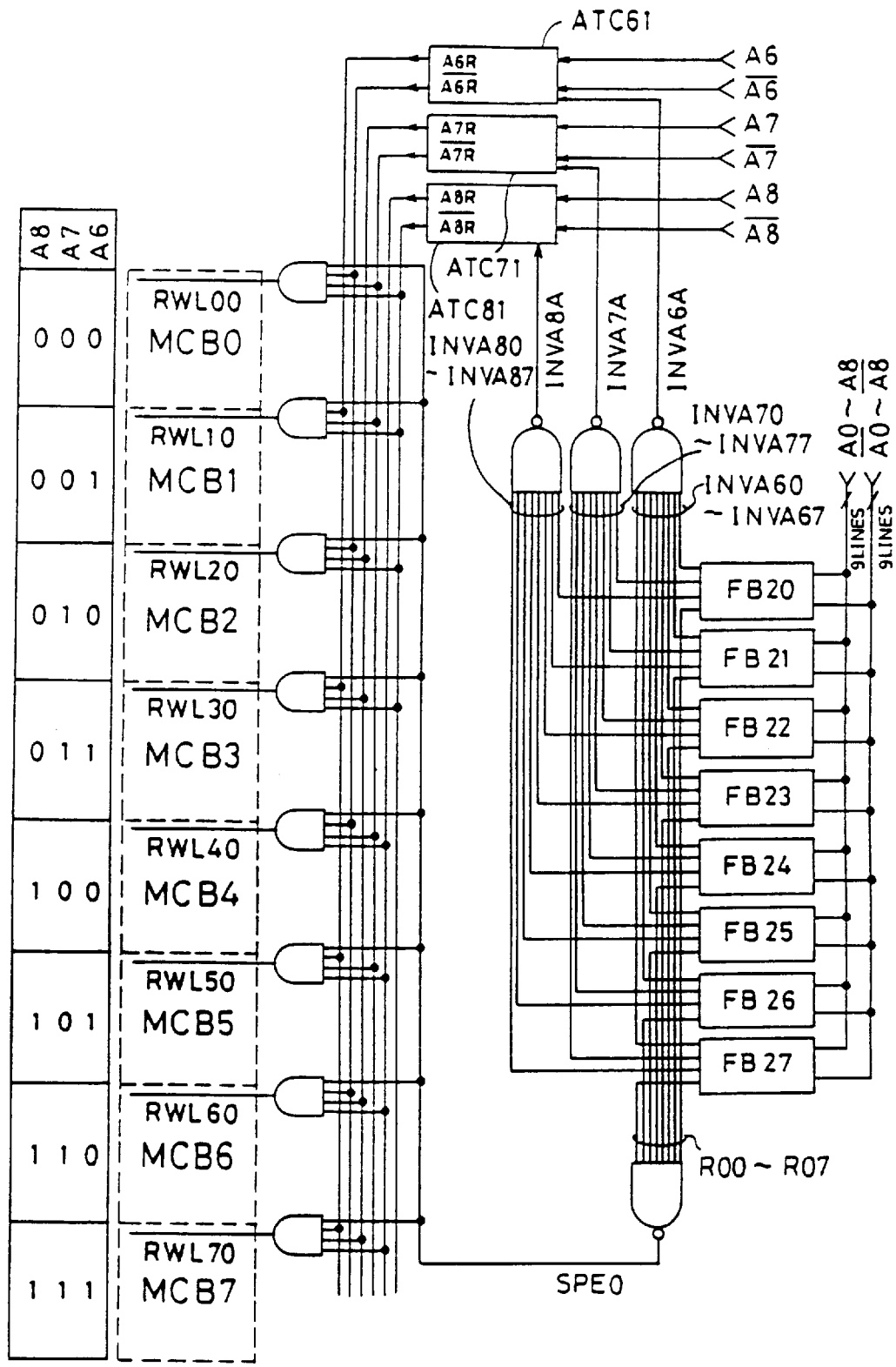
FIG. 5 is a block diagram of the redundant memory cell selecting circuit according to a third embodiment of the present invention.
Figure 6:
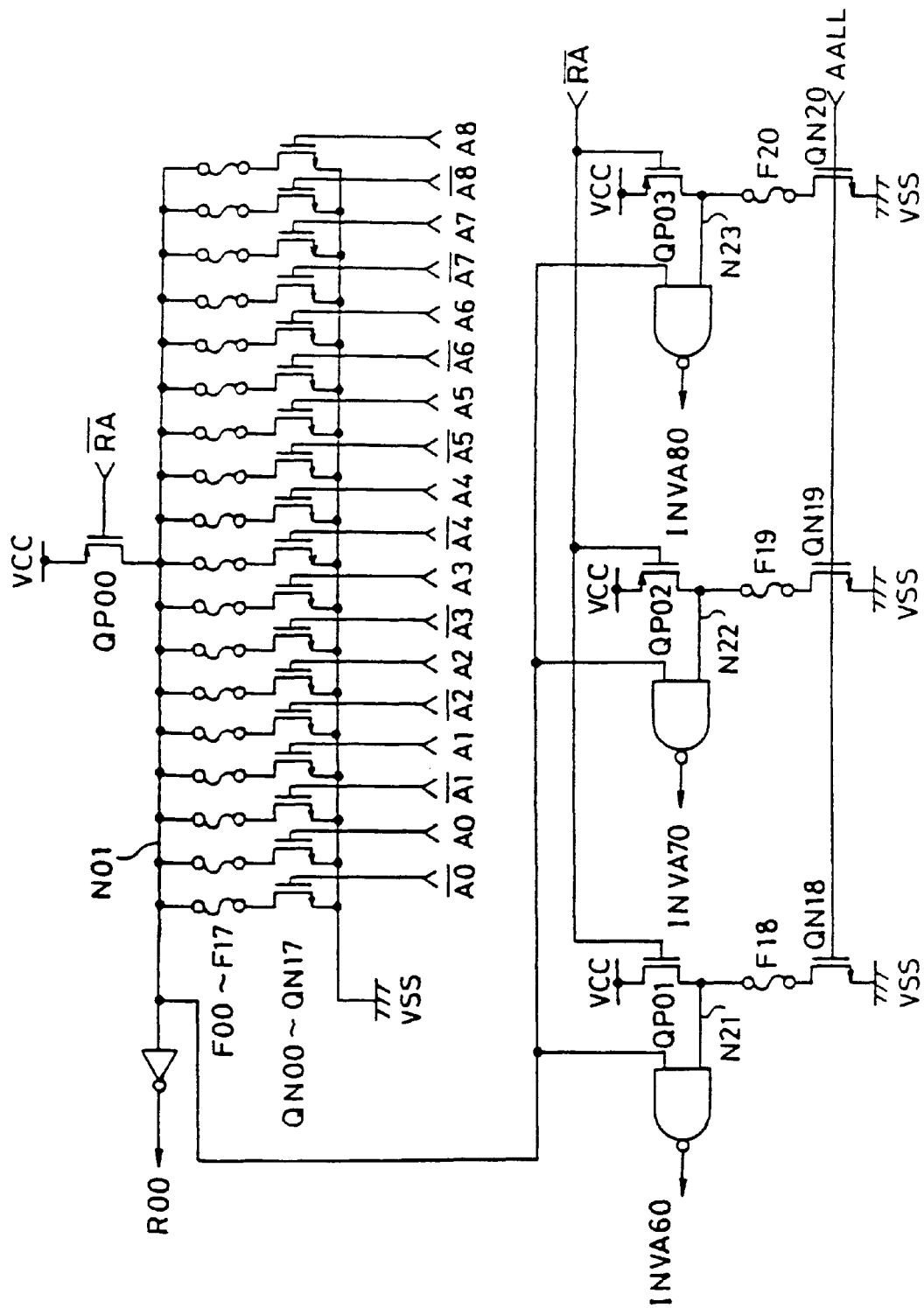
FIG. 6 is a circuit diagram of a selecting fuse circuit block in the redundant memory cell selecting circuit according to the third embodiment of the present invention.
Figure 7:
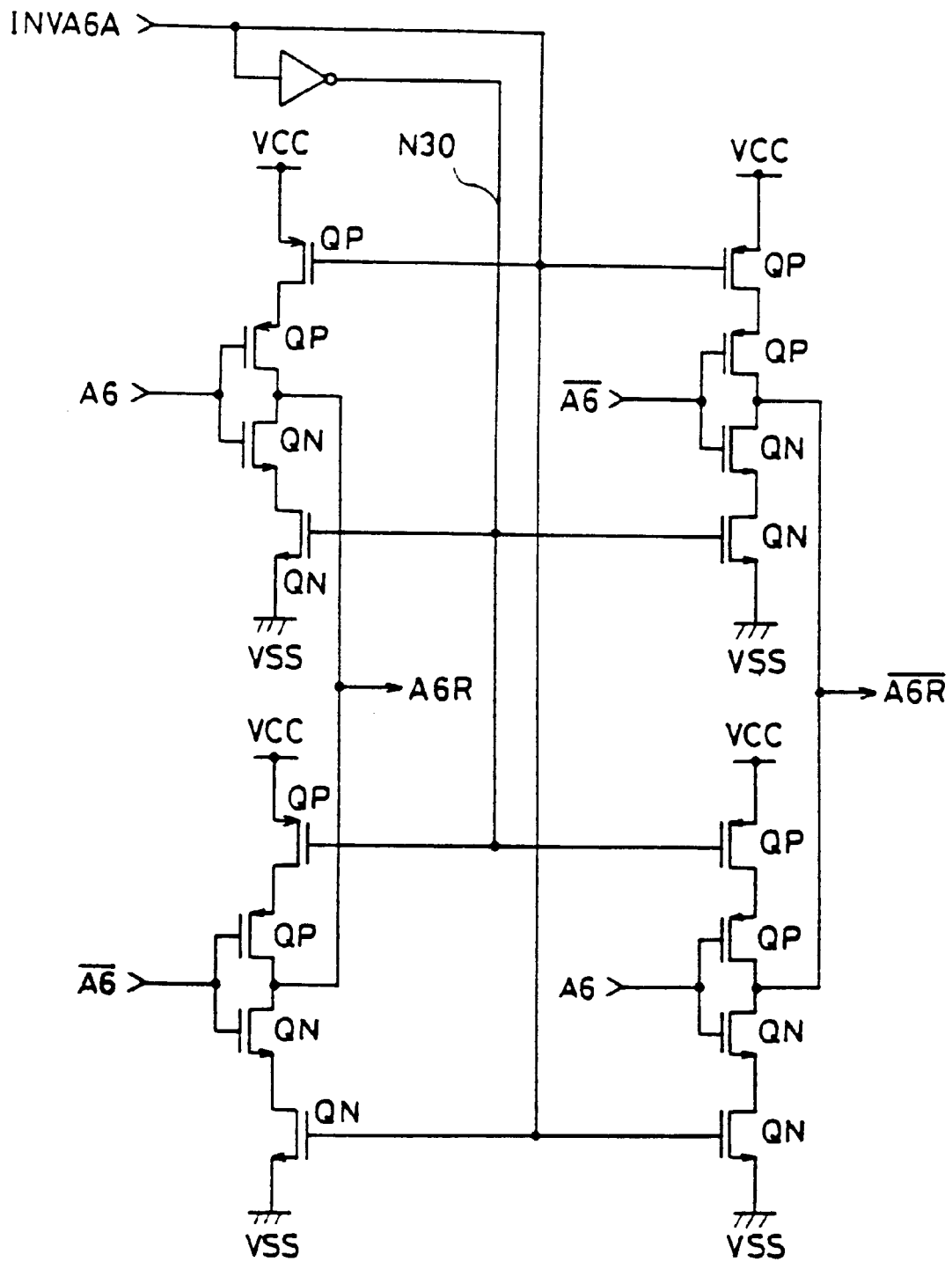
FIG. 7 is a circuit diagram of an address transforming circuit block in the redundant memory cell selecting circuit according to the third embodiment of the present invention.

The following description will discuss the redundant memory cell selecting circuit according to a third embodiment of the present invention with reference to FIGS. 5, 6 and 7.

FIG. 5 shows the redundant memory cell selecting circuit according to the third embodiment, and FIG. 6 shows a selecting fuse circuit block FB20 in FIG. 5. Each of the selecting fuse circuit blocks FB21 to FB27 has an arrangement similar to that of the selecting fuse circuit block FB20. FIG. 7 shows an address transforming circuit block ATC61 in FIG. 5. Each of the address transforming circuit blocks ATC71, ATC 81 has an arrangement similar to that of the address transforming circuit block ATC61.

FIGS. 5, 6 and 7 show: memory cell blocks MCB0 to MCB7; the selecting fuse circuit blocks FB20 to FB27; redundant word line groups RWL00, RWL10 . . . , and RWL70; address transforming circuit blocks ATC61, ATC71, and ATC81; address signals A0 to A8, and /A0 to /A8; internal transforming address signals A6R, A7R, A8R, /A6R, /A7R, and /A8R; signals SPE0, R00 to R07, INVA60 to INVA67, INVA70 to INVA77, INVA80 to INVA87, INVA6A, INVA7A, INVA8A, /RA, AALL, N01, N21 to N23, and N30; fuses F00 to F20, a power voltage VCC; a grounding voltage VSS, N-channel MOS transistors QN, QN00 to QN20; and P-channel MOS transistors QP, QP00 to QP03.

Similar to the first conventional example, the redundant memory cell selecting circuit according to the third embodiment is designed whereby the defective memory cell groups in a plurality of memory cell groups formed at the points of intersections of word lines and bit lines arranged in a grid manner are relieved by being replaced with redundant memory cell groups previously prepared as being connected, respectively, to redundant word line groups.

The redundant memory cell selecting circuit has memory cell blocks MCB0 to MCB7 designed to be selected by the logical voltages of address signals A6 to A8. The memory cell blocks MCB0 to MCB7 have normal memory cell groups and redundant memory cell groups connected to redundant word line groups. The redundant word line groups RWL00 to RWL70 are respectively prepared for the memory cell blocks MCB0 to MCB7. Accordingly, eight total redundants, RWL00 to RWL70, are disposed. Each of the redundant word line groups RWL00 to RWL70 may be replaced with any one of the defective memory cell groups in any of the memory cell blocks. For example, when it is desired to replace a defective memory cell group in the memory cell block MCB0 with the redundant word line group RWL50 in the memory cell block MCB5, a half of (i.e., nine fuses) of the eighteen fuses, F00 to F17, are disconnected in the selecting fuse circuit block FB20 in FIG. 6. As such, the address of the defective memory cell group in the memory cell block MCB0 is selected. In the memory cell block selecting address of the memory cell block MCB0, the address signal A6 is "0", the address signal A7 is "0", and the address signal A8 is "0". In the selecting address of the MCB5, the address signal A6 is "1", the address signal A7 is "0", and the address signal A8 is "1". To switch the selection of memory cell block from MCB0 to MCB5, fuses F18 and F20 may be disconnected, respectively, to the corresponding address signals A6 and A8. As such, these address signals A6 to A8 corresponding to the memory cell blocks MCB0 and MCB5, are reverse in logic to each other.

The following description will discuss in detail the operation of the redundant memory cell selecting circuit according to the third embodiment. FIG. 6 shows the selecting fuse circuit block FB20. Each of the selecting fuse circuit blocks FB21 to FB27 has an arrangement similar to that of the selecting fuse circuit block FB20.

In FIG. 6, when the logical voltage of the signal /RA is first made "L", the P-channel MOS transistors QP00 to QP03 are turned on, and the logical voltages of the signals N01, N21 to N23 become "H". Thereafter, the logical voltage of the signal /RA becomes "H", and address signals selected from the address signals A0 to A8, and /A0 to /A8 are supplied from, for example, an address buffer incorporated in the memory device. Here, the address signals /A0 to /A8 are the logical voltage signals of which logics are reverse to those of the address signals A0 to A8.

The address signals A0 to A8 and /A0 to /A8 are respectively entered into the gates of the eighteen N-channel MOS transistors, QN00 to QN17, of which half of (i.e., nine) the transistors are then turned on.

At this time, when all nine of the fuses which correspond to the selected address are disconnected, the logical voltage of the signal N01 becomes "H" and the logical voltage of the signal R00 remains "L".

The logical voltage of the signal AALL simultaneously becomes "H" when the address signals A0 to A8 and /A0 to /A8 are determined and selected. When the fuses F18 and F20 are disconnected, the logical voltages of the signals N21 and N23 become "H" and the logical voltage of the signal N22 becomes "L". As discussed above, since the logical voltage of the signal N01 is "H", the logical voltages of the signals INVA60 and INVA80 become "L", and the logical voltage of the signal INVA70 becomes "H".

In turn, the signal INVA60, of which logical voltage is "L", is entered into the address transforming circuit block ATC61 of the address signal A6 in FIG. 7, so that the internal address signal A6R becomes the signal of which logical voltage is reverse to that of the address signal A6. Also, the internal address signal /A6R becomes the signal of which logical voltage is reverse to that of the address signal /A6. Likewise, the signal INVA70, of which logical voltage is "H", and the signal INVA80, of which logical voltage is "L", are respectively entered into the address transforming circuit blocks ATC71, ATC81 of the address signals A7, A8.

Accordingly, the internal address signal A7R becomes the signal of which logical voltage is the same as that of the address signal A7. The internal address signal /A7R becomes the signal of which logical voltage is the same as that of the address signal /A7. The internal address signal ABR becomes the signal of which logical voltage is reverse to that of the address signal A8, and the internal address signal /A8 becomes the signal of which logical voltage is reverse to that of the address signal /A8.

In such a manner, the defective memory cell group of the memory cell block MCB0 can be replaced with the redundant memory cell group connected to the redundant word line group RWL50 of the memory cell block MCB5.

In the redundant memory cell selecting circuit of the third embodiment having the above-mentioned arrangement, eight selecting fuse circuit blocks are prepared, and 21 fuses are required for each of the selecting fuse circuit blocks. Accordingly, the total number of the fuses is 168 (i.e., 21×8=168), resulting in a 87.5% reduction as compared with 192 (i.e., 12×16) fuses in the first conventional example.

The redundant memory cell selecting circuit according to the third embodiment is characterized in that the number of the redundant word line groups and the number of the selecting fuse circuit blocks are reduced, enabling the total area of the memory device to be reduced. Also, the number of memory cell groups to be relieved in each memory cell block is increased from 2, the conventional number, to 8, thus increasing the degree of freedom for relief by the redundant memory cell groups.

(Fourth Embodiment)

Figure 8:
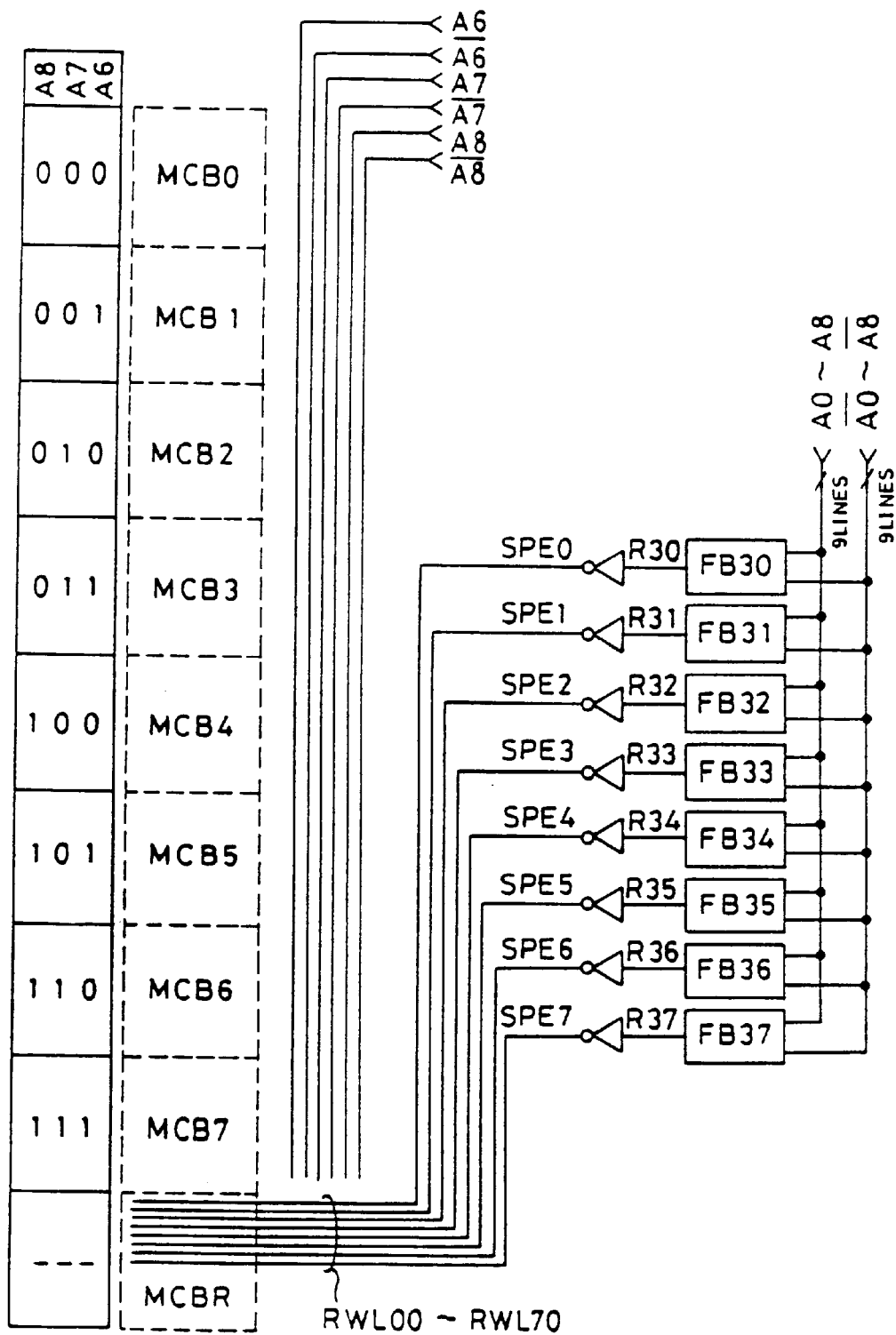
FIG. 8 is a block diagram of the redundant memory cell selecting circuit according to a fourth embodiment of the present invention.
Figure 12:
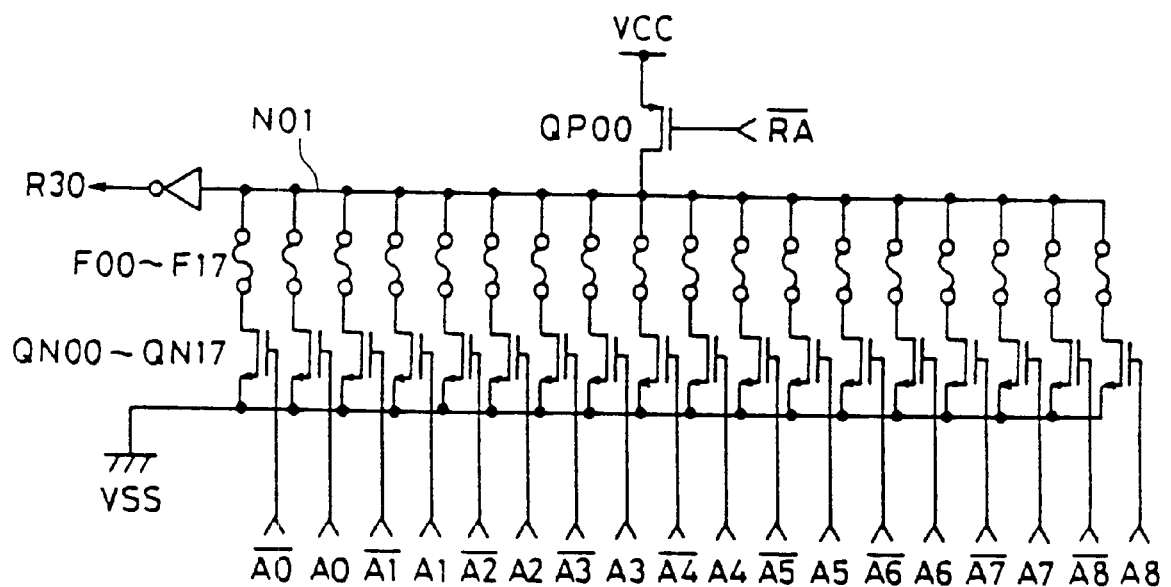
FIG. 12 is a circuit diagram of a selecting fuse circuit block in the redundant memory cell selecting circuit according to each of the fourth and seventh embodiments of the present invention.

The following description will discuss the redundant memory cell selecting circuit according to a fourth embodiment of the present invention with reference to FIGS. 8 and 12.

FIG. 8 shows the redundant memory cell selecting circuit according to the fourth embodiment, and FIG. 12 shows a selecting fuse circuit block FB30 in FIG. 8. Each of selecting fuse circuit blocks FB31 to FB37 has an arrangement similar to that of the selecting fuse circuit block FB30.

FIGS. 8 and 12 show: memory cell blocks MCB0 to MCB7; dedicated redundant memory cell block MCBR; the selecting fuse circuit blocks FB30 to FB37; redundant word line groups RWL00, RWL10, RWL70; address signals A0 to A8 and /A0 to /A8; signals SPE0 to SPE7, R30 to R37, /RA, and N01; fuses F00 to F17; a power voltage VCC; a grounding voltage VSS; N-channel MOS transistors QN00 to QN17; and a P-channel MOS transistor QP00.

Similar to the first conventional example, the redundant memory cell selecting circuit according to the fourth embodiment is designed whereby the defective memory cell groups in a plurality of memory cell groups formed at the points of intersections of word lines and bit lines arranged in a grid manner, are relieved by being replaced with redundant memory cell groups in a dedicated redundant memory cell block previously prepared.

The redundant memory cell selecting circuit has eight memory cell blocks MCB0 to MC37 designed to be selected by the logical voltages of address signals A6 to A8, and a dedicated redundant memory call block MCBR.

For example, when it is desired to replace a defective memory cell group) in the memory cell block MCB3 with the redundant word line group RWL00, half of (i.e., nine) fuses of the eighteen fuses P00 to P17 are disconnected in the selecting fuse circuit block such that the address of the defective memory cell group in the memory cell block MCB3 is selected.

The following description will discuss the operation of the redundant memory cell selecting circuit according to the fourth embodiment. FIG. 12 shows the selecting fuse circuit block FB30. Each of the selecting fuse circuit blocks FB31 to FB37 has an arrangement similar to that of the selecting fuse circuit block FB30.

In FIG. 12, the logical voltage of the signal /RA becomes "L" to turn on the P-channel MOS transistor QP00, and the logical voltage of the signal N01 becomes "H". Thereafter, the logical voltage of the signal /RA becomes "H", and the address signals A0 to A8 and /A0 to /A8 supply an address selected. Here, the address signals /A0 to /A8 are the logical-voltage signals of which logics are reverse to those of the address signals A0 to A8.

The address signals A0 to A8, /A0 to /A8 are respectively entered into the gates of the eighteen N-channel MOS transistors QN00 to QN17, of which half of (i.e., nine) the eighteen transistors are then turned on.

At this time, when all the nine fuses corresponding to the selected address are disconnected, the logical voltage of the signal N01 becomes "H" and the logical voltage of the signal R30 remains "L".

In such a manner, the defective memory cell group in the memory cell block MCB3 can be replaced with the redundant memory cell group connected to the redundant word line group RWL00 of the dedicated redundant memory cell block MCBR.

In the redundant memory cell selecting circuit of the fourth embodiment having the above-mentioned arrangement, eight selecting fuse circuit blocks are prepared, of which IS fuses are required for each of the selecting fuse circuit blocks. Accordingly, the total number of the fuses is 144 (i.e., 18×8=144), resulting in a 75% reduction as compared with 192 fuses in the first conventional example.

Similar to the third embodiment, the redundant memory cell selecting circuit according to the fourth embodiment is characterized in that the number of the redundant word line groups and the number of the selecting fuse circuit blocks are reduced, enabling the memory device to be reduced in total area, and increasing the number of memory cell groups to be relieved in each memory cell block from 2 (i.e., the conventional level of relief) to 8. Thereby, increasing the degree of freedom for relief by the redundant memory cell groups.

(Fifth Embodiment)

Figure 9:
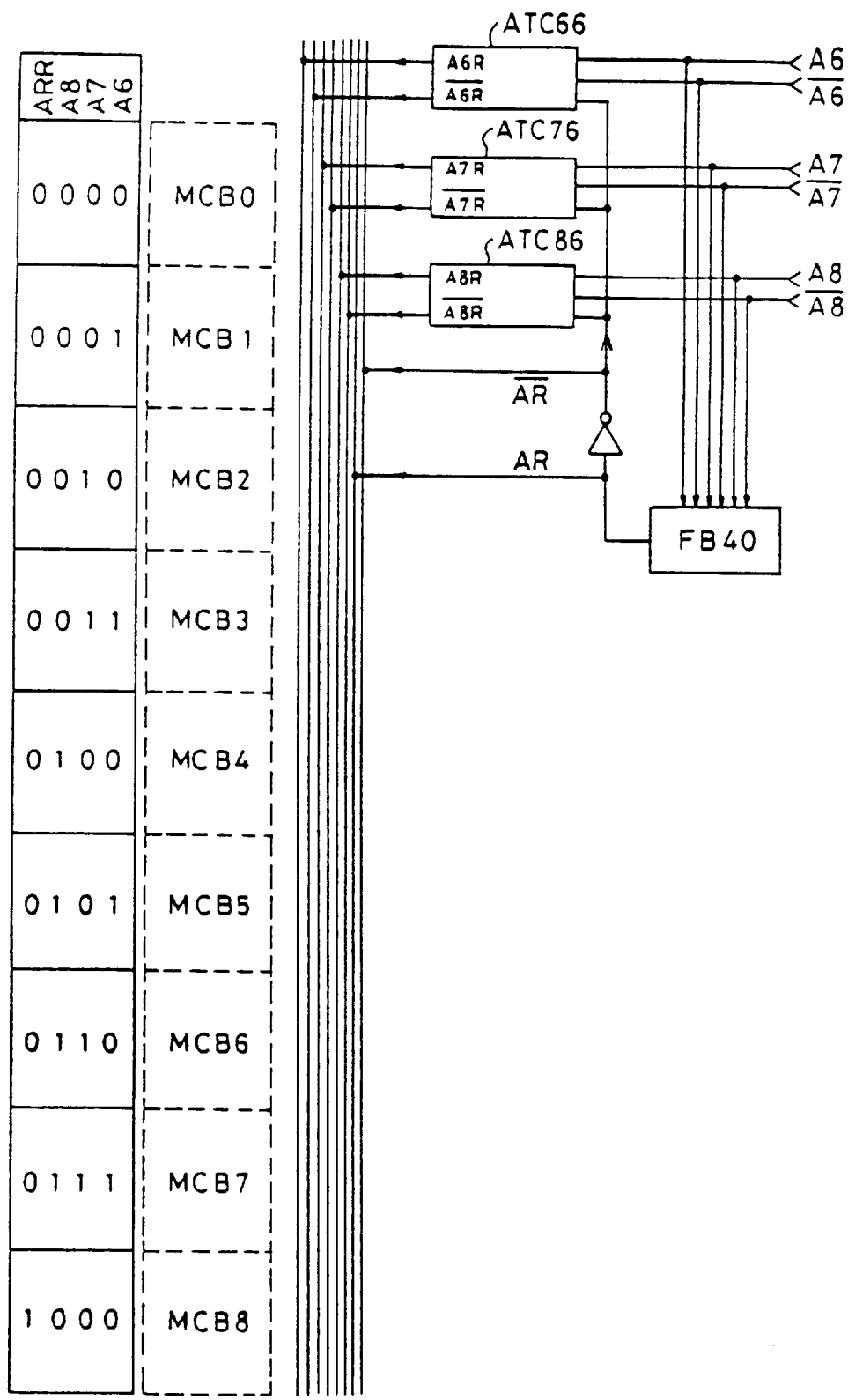
FIG. 9 is a block diagram of the redundant memory cell selecting circuit according to a fifth embodiment of the present invention.
Figure 13:
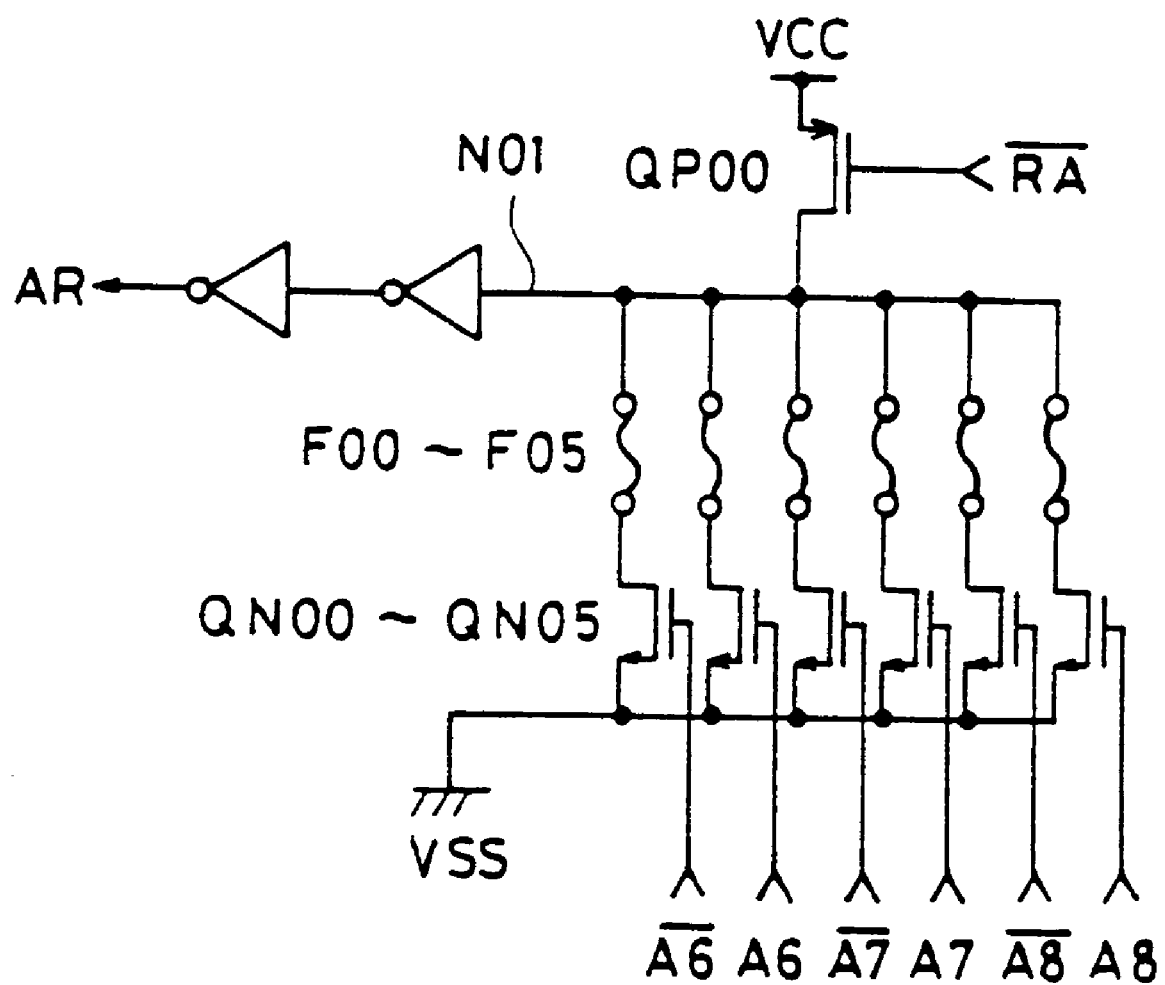
FIG. 13 is a circuit diagram of a selecting fuse circuit block in the redundant memory cell selecting circuit according to each of the fifth, sixth and seventh embodiments of the present invention.
Figure 14:
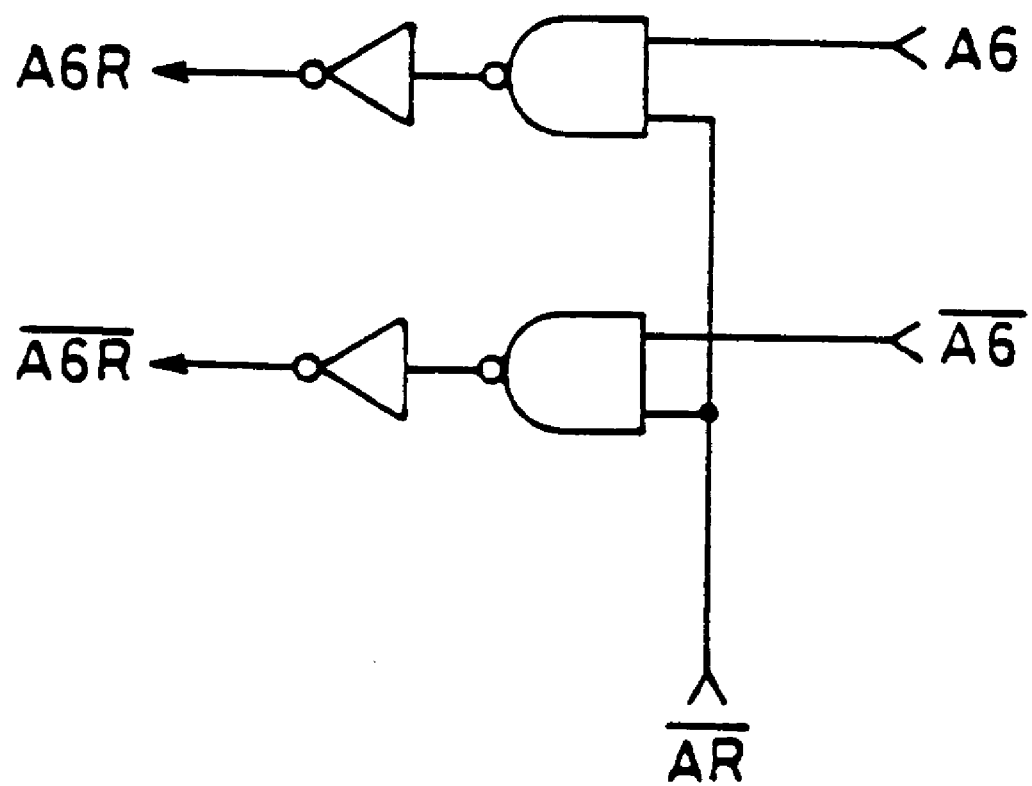
FIG. 14 is a circuit diagram of an address transforming circuit block in the redundant memory cell selecting circuit according to each of the fifth, sixth and seventh embodiments of the present invention.

The following description will discuss the redundant memory cell selecting circuit according to a fifth embodiment of the present invention with reference to FIGS. 9, 13 and 14.

FIG. 9 shows the redundant memory cell selecting circuit according to the fifth embodiment. FIG. 13 shows a selecting fuse circuit block FB40 in FIG. 9 and FIG. 14 shows an address transforming circuit block ATC66 of FIG. 9. Each of the address transforming circuit blocks ATC76, ATC86 has an arrangement similar to that of the address transforming circuit block ATC66.

FIGS. 9, 13 and 14 show: memory cell blocks MCB0 to MCB8; the selecting fuse circuit block FB40; address signals A0 to A8 and /A0 to /A8; internal transforming address signals MR, A7R, MR, /A6R, /A7R, /A8R; signals AR, /AR, /RA, and N01; fuses F00 to F05; a power voltage VCC; a grounding voltage VSS; N-channel MOS transistors QN00 to QN05; a P-channel MOS transistor QP00; and the address transforming circuit blocks ATC66, ATC76, and ATC86.

According to the fifth embodiment, the redundant memory cell selecting circuit has nine memory cell blocks MCB0 to MCB8. One of the these nine memory cell blocks is selectively used as a spare memory cell block with the eight memory cell blocks used as non-defective memory cell blocks.

The memory cell blocks MCB are designed to be selected by the logical voltages of the address signals A6 to A8. For example, if a defect occurs in the memory cell block MCB3, the fuses F01, F03, F04 in the selecting fuse circuit block FB40 are disconnected.

The following description will discuss the operation of the redundant memory cell selecting circuit according to the fifth embodiment.

FIG. 13 shows the selecting fuse circuit block FB40. In FIG. 13, the logical voltage of the signal /RA becomes "L" to turn on the P-channel MOS transistor QP00, and the logical voltages of the signals N01 becomes "H". Thereafter, the logical voltage of the signal /RA becomes "H", and the address signals A6 to A8, /A6 to /A8 supply a selected memory cell block selecting address. Here, the address signals /A6 to /A8 are the logical-voltage signals of which logics are reverse to those of the address signals A6 to A8.

When the memory cell block selecting address corresponding to the memory cell block MCB3 is selected, the logical voltage of the signal N01 becomes "H" and the logical voltage of the signal AR remains "H". As a result, the memory cell block MCB3 is replaced with the memory cell block MCB8 thus selected.

The redundant memory cell selecting circuit according to the fifth embodiment is characterized in that a defective memory cell block can be wholly replaced with a non-defective memory cell block.

(Sixth Embodiment)

Figure 10:
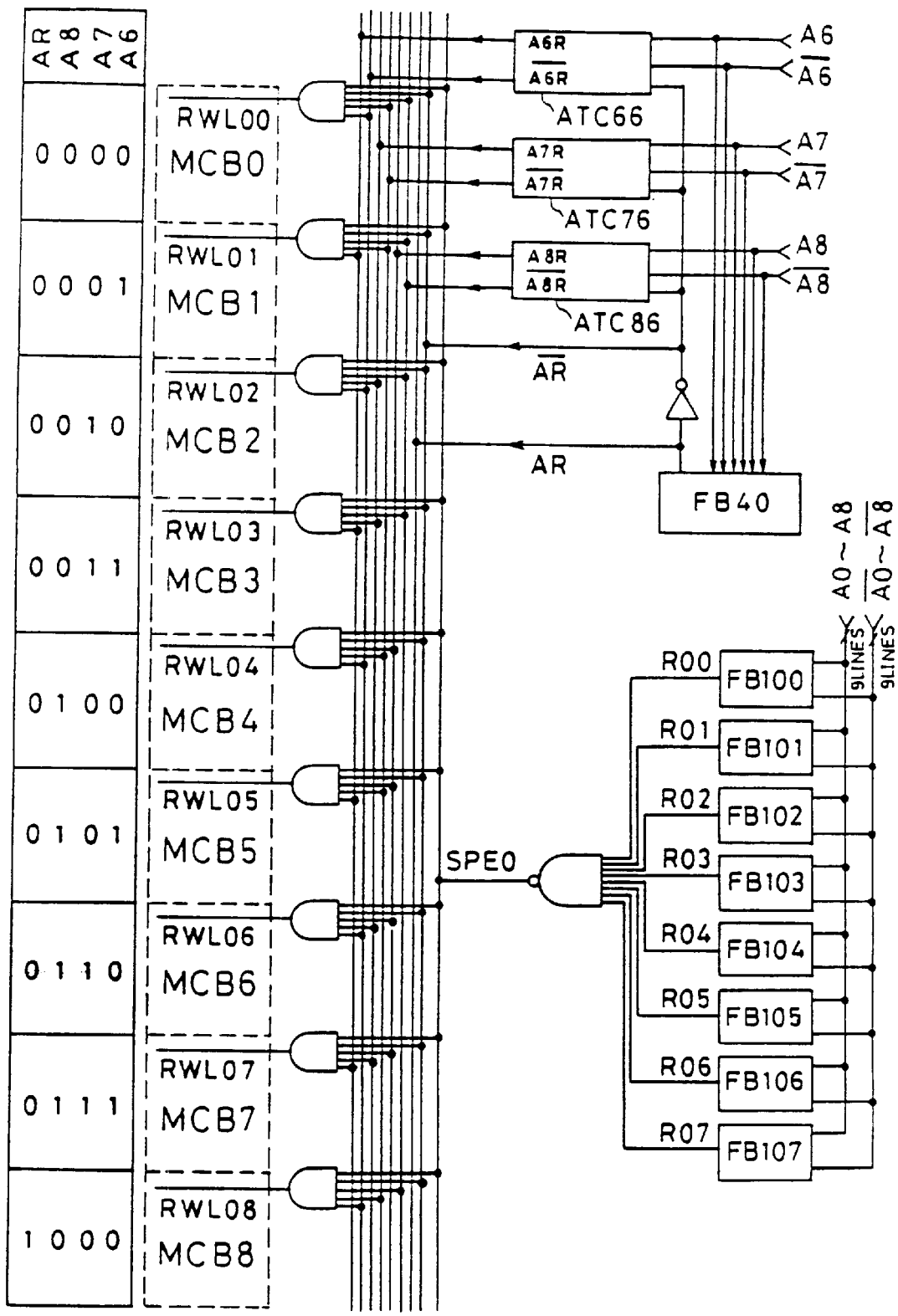
FIG. 10 is a block diagram of the redundant memory cell selecting circuit according to a sixth embodiment of the present invention.

The following description will discuss the redundant memory cell selecting circuit according to a sixth embodiment of the present invention with reference to FIGS. 10, 13 and 14.

Figure 22:
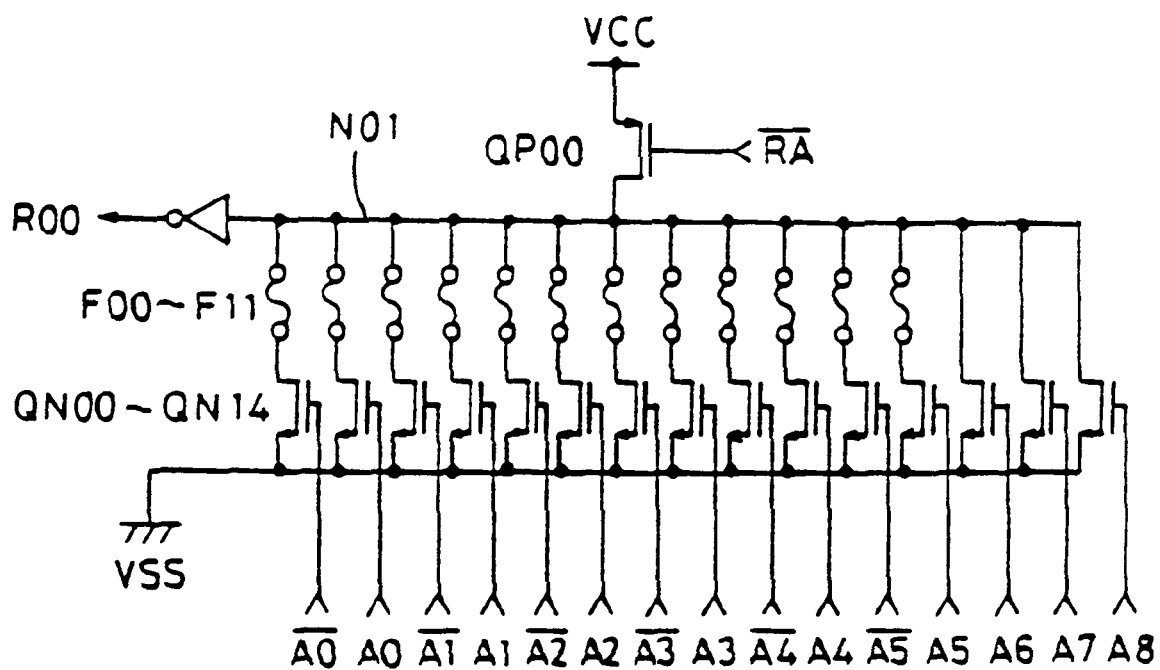
FIG. 22 is a circuit diagram of a selecting fuse circuit blocks in the first conventional redundant memory cell selecting circuit.
Figure 23:
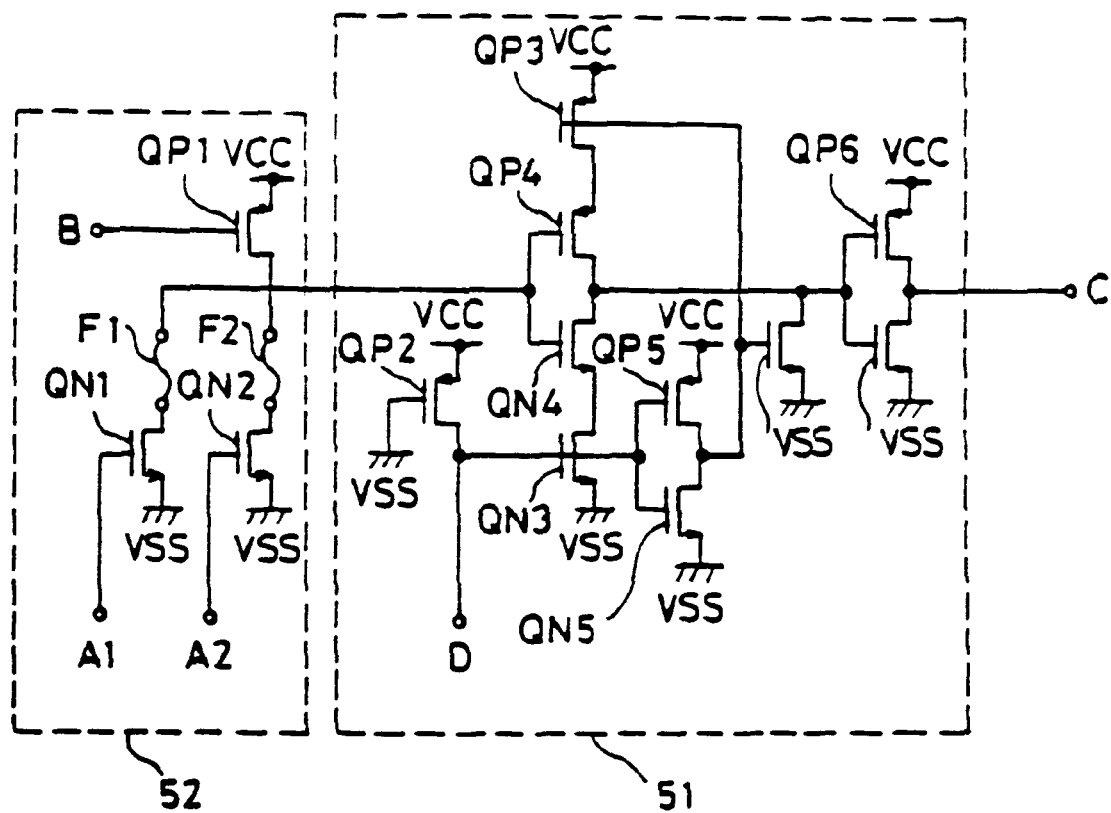
FIG. 23 is a circuit diagram of a redundant memory cell testing circuit block in a second conventional redundant memory cell selecting circuit.

FIG. 10 shows the redundant memory cell selecting circuit according to the sixth embodiment, FIG. 13 shows a selecting fuse circuit block FB40 in FIG. 10. FIG. 14 shows an address transforming circuit block ATC66 from FIG. 10. Each of the address transforming circuit blocks ATC76, ATC86 has an arrangement similar to that of the address transforming circuit block ATC66. In this sixth embodiment, selecting fuse circuit blocks FB100 to FB107 in FIG. 10 are similar to those in the redundant memory cell selecting circuit of the first conventional example shown in FIG. 22.

FIGS. 10, 13 and 14 show: memory cell blocks MCB0 to MCB8; the selecting fuse circuit blocks FB100 to FB107, and FB40; redundant word line groups RWL00 to RWL08; address signals A0 to A8 and /A0 to /A8; internal transforming address signals MR, A7R, MR, /A6R, /A7R, /A8R; signals AR, /AR, /RA, N01; fuses F00 to FOS; a power voltage VCC; a grounding voltage VSS; N-channel MOS transistors QN00 to QN05; a P-channel MOS transistor QP00; and the address transforming circuit blocks ATC66, ATC76, ATC86.

According to the sixth embodiment, the redundant memory cell selecting circuit has an arrangement in which redundant word line groups are disposed for each of the memory cell blocks in the fifth embodiment. One of the nine memory cell-blocks MCB0 to MC38 is selectively used as a spare memory cell block, and the remaining eight memory cell blocks which are less defective are selectively used. A defective memory cell group in a memory cell block is designed to be replaced with a redundant memory cell block connected to the redundant word line group. A memory cell block may be selected in the same manner as in the fifth embodiment. A defective memory cell group in a memory cell block may be replaced in the same manner as in the first conventional example.

The redundant memory cell selecting circuit according to the sixth embodiment is characterized in that a defective memory cell block can be wholly replaced with a non-defective memory cell block, and in that a defective memory cell group in a memory cell block can be replaced with a redundant memory cell group.

The sixth embodiment uses the selecting fuse circuit blocks similar to those used in the first conventional example. However, when the selecting fuse circuit blocks similar to those used in the first embodiment are used, the number of the selecting fuse circuit blocks can be further reduced, thus enabling the area of the memory device to be further reduced.

(Seventh Embodiment)

The following description will discuss the redundant memory cell selecting circuit according to a seventh embodiment of the present invention with reference to FIGS. 11, 12, 13 and 14.

Figure 11:
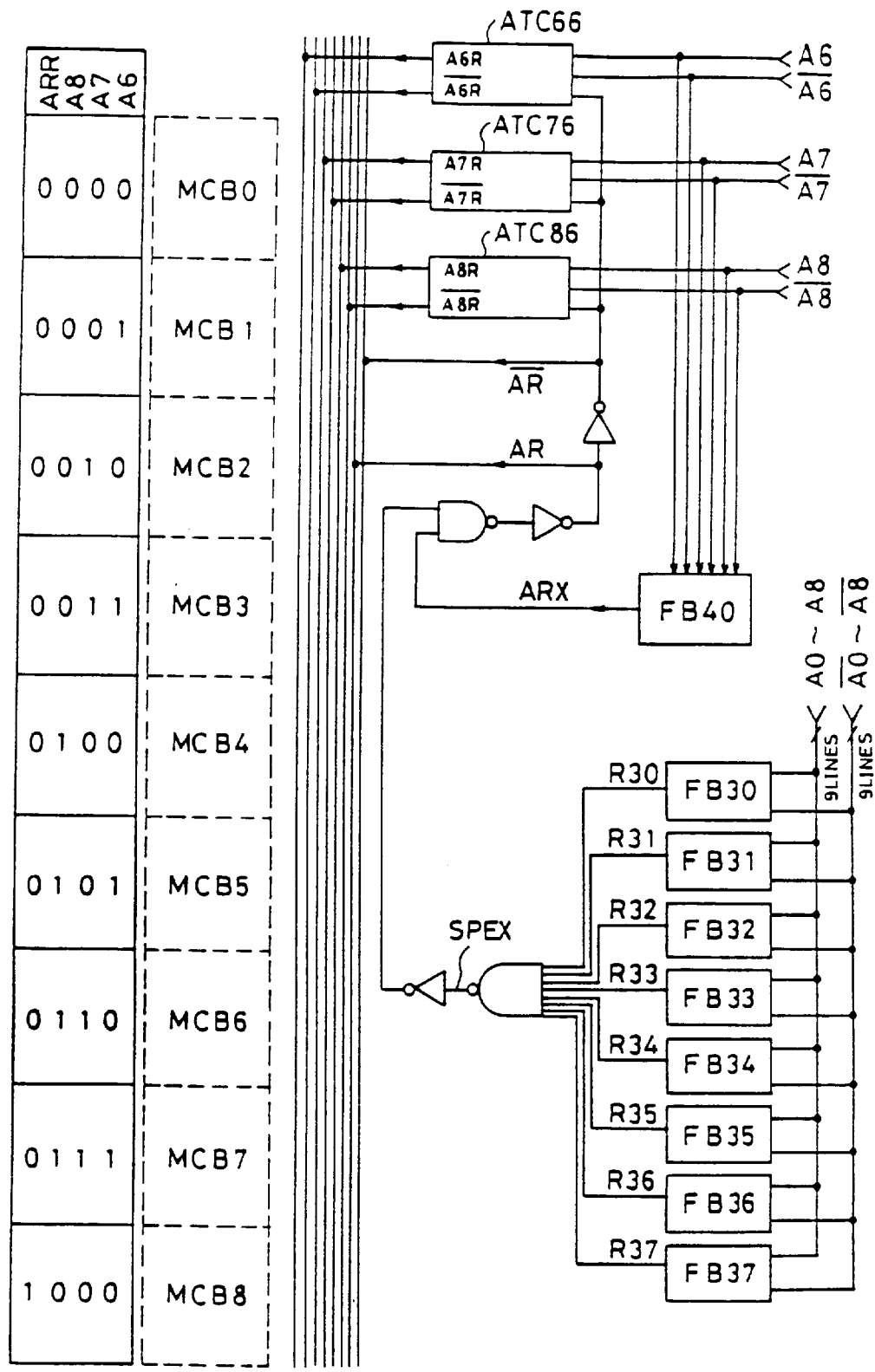
FIG. 11 is a block diagram of the redundant memory cell selecting circuit according to a seventh embodiment of the present invention.

FIG. 11 shows the redundant memory cell selecting circuit according to the seventh embodiment. FIG. 12 shows a selecting fuse circuit block FB30 from FIG. 11. Each of the selecting fuse circuit blocks FB31 to FB37 has an arrangement similar to that of the selecting fuse circuit block FB30. FIG. 13 shows a selecting fuse circuit block FB40 in FIG. 11. FIG. 14 shows an address transforming circuit block ATC66 from FIG. 11. Each of address transforming circuit blocks ATC76, ATC86 has an arrangement similar to that of the address transforming circuit block ATC66.

FIGS. 11 to 14 show: memory cell blocks MCB0 to MCB8; the selecting fuse circuit blocks FB30 to FB37, and FB40; address signals A0 to A8 and /A0 to /A8; internal transforming address signals A6R, A7R, A8R, /A6R, /A7R, and /A8R; signals SPEX, R30 to R37, AR, /AR, ARX, /RA, and N01, fuses F00 to F17, a power voltage VCC, a grounding voltage VSS; N-channel MOS transistors QN00 to QN17; a P-channel MOS transistor QP00; and the address transforming circuit blocks ATC66, ATC76, and ATC86.

According to the seventh embodiment, the redundant memory cell selecting circuit is designed whereby the good memory cell groups in a memory cell block which are defective yet not selected, as in the fifth embodiment, are used as redundant memory cell groups.

The redundant memory cell selecting circuit has the nine memory cell blocks MCB0 to MCB8. Out of these nine memory cell blocks, one is selectively used as a spare memory cell block and the remaining eight memory cell blocks, which are less defective, are selectively used. For the defective memory cell groups among the eight memory cell blocks to be selected, the memory cell groups in the spare memory cell block are used as redundant memory cell groups. A memory cell block may be selected in the same manner as in the fifth embodiment. The replacement of a defective memory cell group in a memory cell block is made in such a manner that when the address stored in any of the selecting fuse circuit blocks FB30 to FB37 is selected, the address transforming circuit blocks ATC66 to ATC86 are not operated.

The redundant memory cell selecting circuit according to the seventh embodiment is characterized in that a defective memory cell block can be wholly replaced with a non-defective memory cell block, and where a defective memory cell group in a memory cell block existing out of the remaining memory cell blocks can be replaced with a memory cell group in the spare memory cell block.

(Eighth Embodiment)

Figure 15:
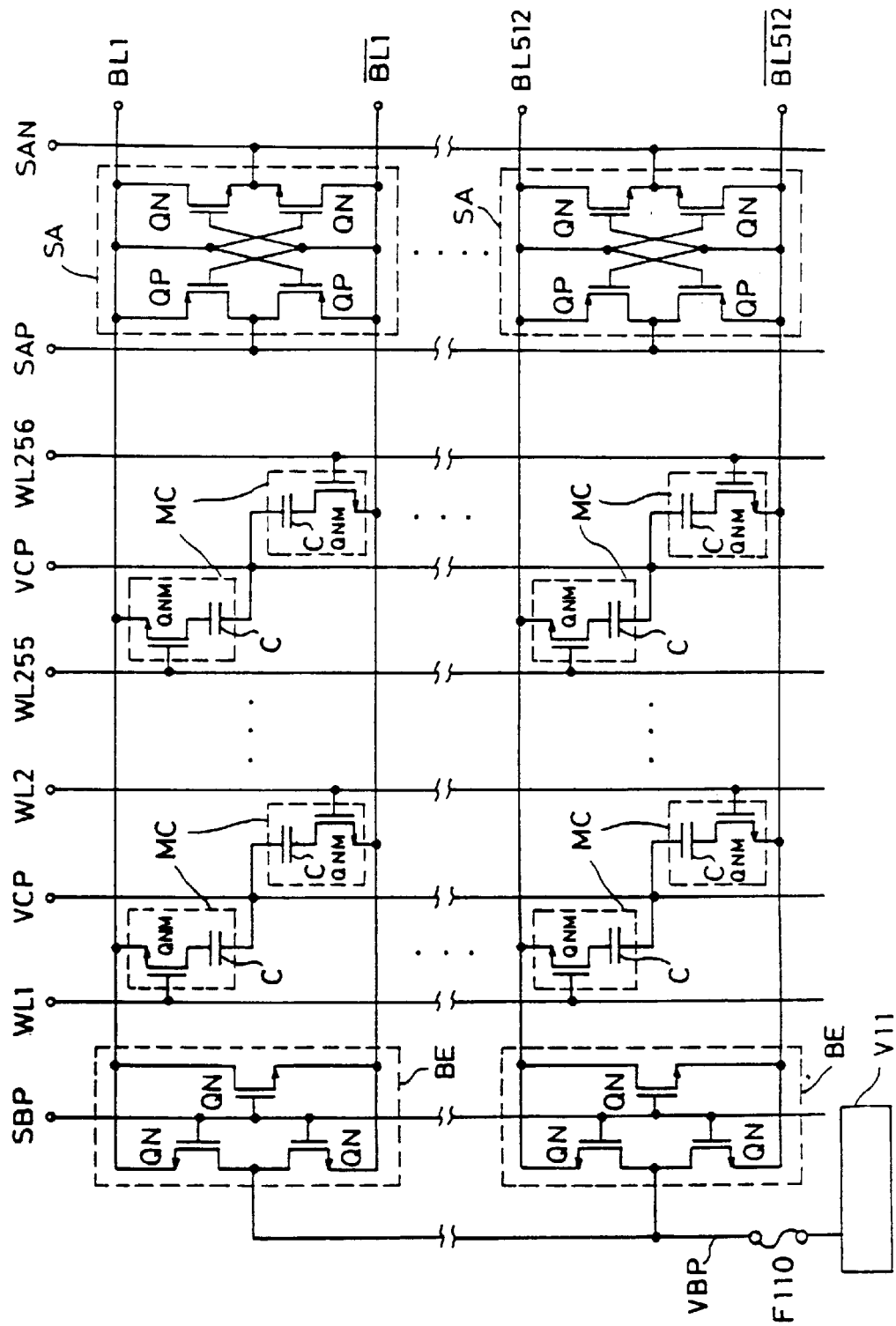
FIG. 15 is a circuit diagram of a memory cell block in the redundant memory cell selecting circuit according to an eighth embodiment of the present invention.

The following description will discuss the redundant memory cell selecting circuit according to an eighth embodiment of the present invention with reference to FIG. 15.

FIG. 15 shows one of the memory cell blocks in the redundant memory cell selecting circuit according to the eighth embodiment, which is similar to the redundant memory cell selecting circuit according to the fifth embodiment shown in FIG. 9.

FIG. 15 shows: a bit line recharge power supply Vll, a fuse F110; bit line equalize and precharge circuits BE; memory cells MC; sense amplifying circuits SA; memory cell capacitors C; N-channel MOS transistors QN, and QNM; P-channel MOS transistors QP; and signals VBP, SBP, VCP, SAP, and SAN; word lines WL1, WL2, . . . , WL255, and WL256; and bit lines BL1, BL2, BL512, /BL1, /BL2, . . . , /BL512.

According to the redundant memory cell selecting circuit of the eighth embodiment, the transmission line transmitting a bit line precharge power supply node signal VBP can be disconnected from the precharge power supply VII by disconnecting the fuse F110.

When the memory device stands ready, the logical voltage of the bit line equalize and precharge signal SBP is "H", and the bit lines BL1 to BL512 and /BL1 to BL512 are connected to the transmission line transmitting the bit line precharge power supply node signal VBP, and the word lines WL1 to WL256 are connected to the grounding voltage VSS.

The redundant memory cell selecting circuit according to the eighth embodiment is characterized in that, when memory cell blocks become defective due to short-circuit between the bit lines and the word lines in the course of the production of the memory device, such defective memory cell blocks are not used. Further it is characterized in that the fuse F110 is disconnected so as to disconnect the transmission line transmitting the bit line precharge power supply node signal VBP from the bit line precharge power supply Vll. Thereby, causing the potentials of the bit lines and the word lines to be equalized, so that a defect in the power current can be relieved.

(Ninth Embodiment)

Figure 16:
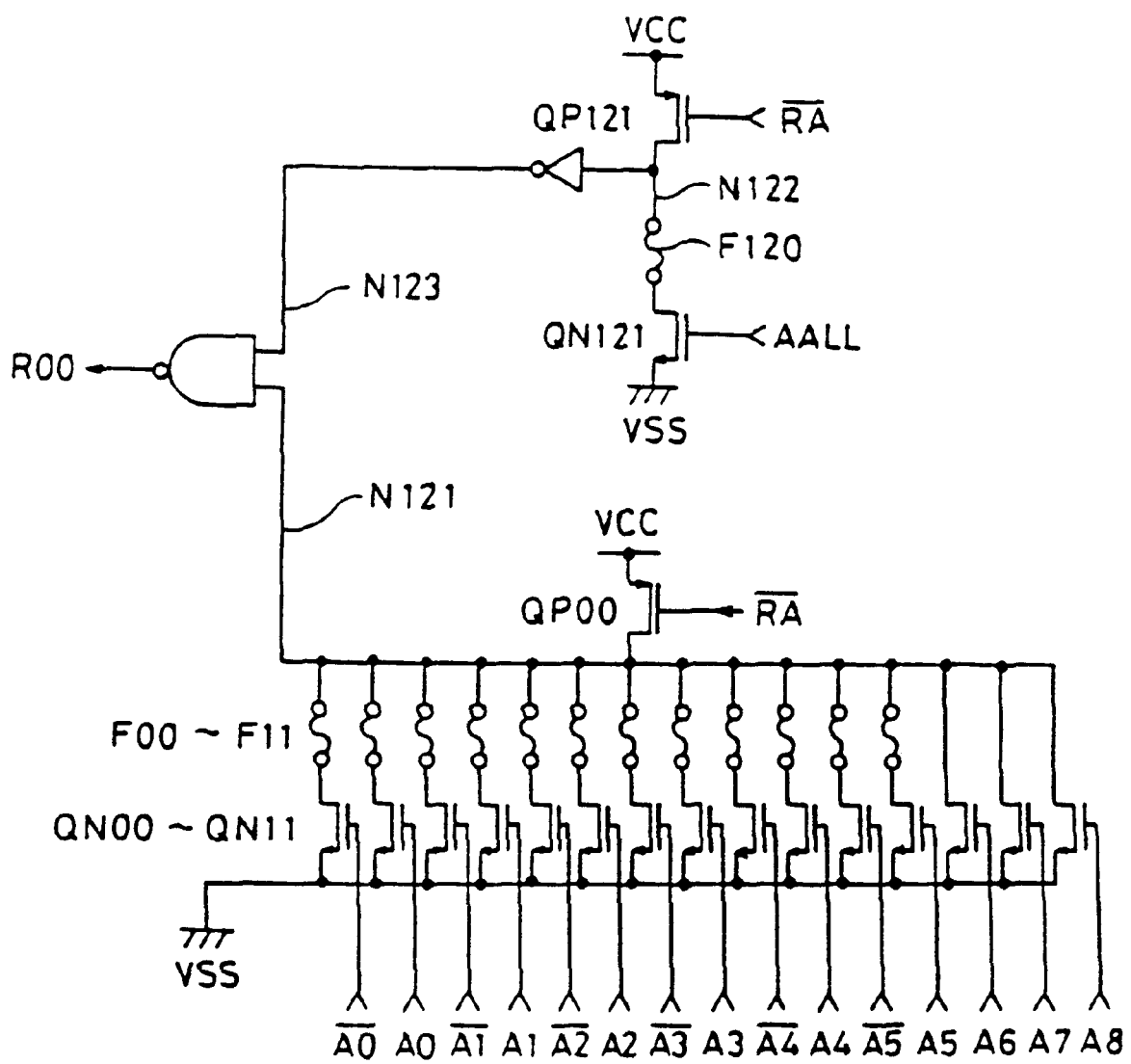
FIG. 16 is a circuit diagram of a selecting fuse circuit block in the redundant memory cell selecting circuit according to a ninth embodiment of the present invention.

The following description will discuss the redundant memory cell selecting circuit according to a ninth embodiment of the present invention with reference to FIG. 16.

Figure 21:
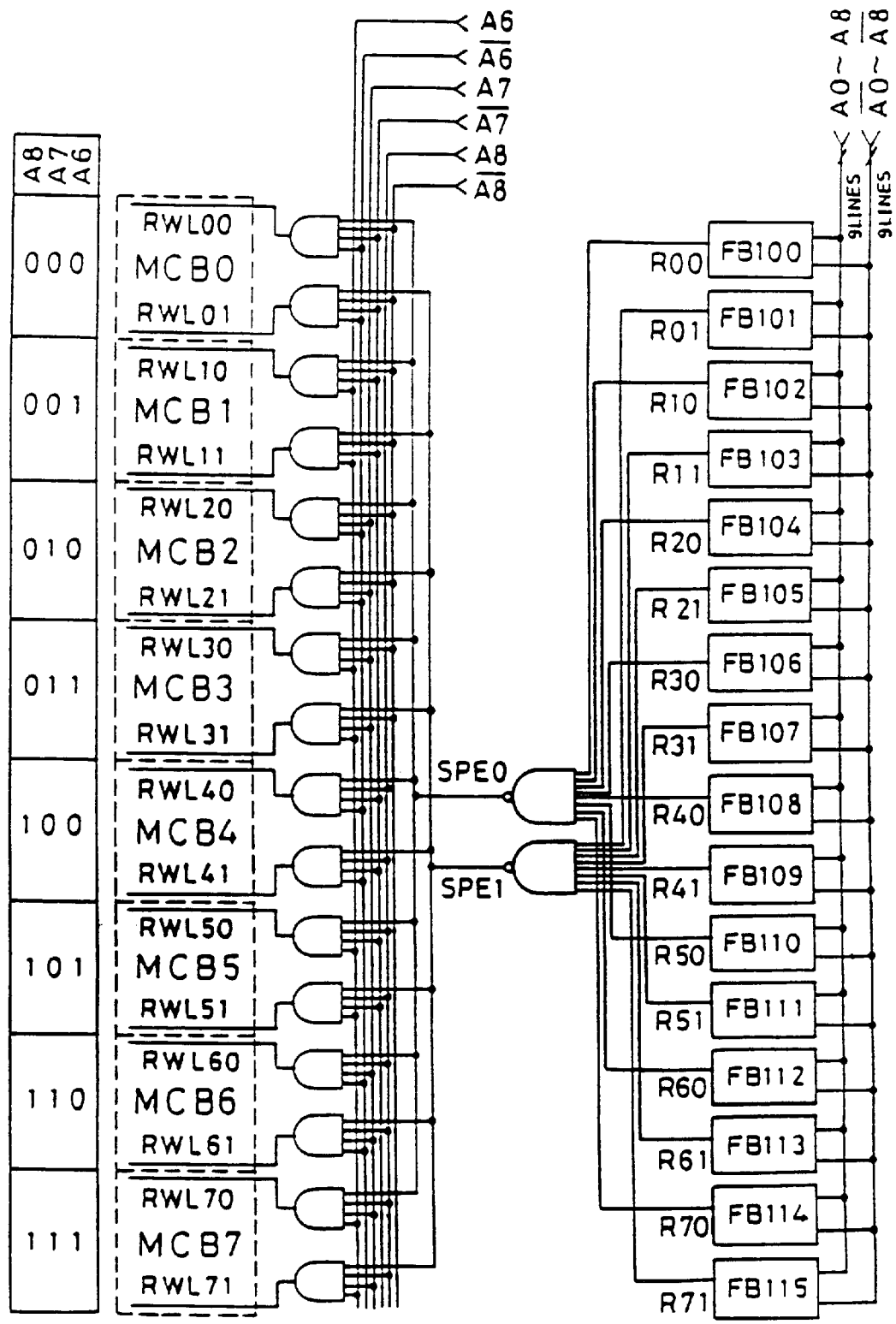
FIG. 21 is a block diagram of a first conventional redundant memory cell selecting circuit.

FIG. 16 shows one of selecting fuse circuit blocks of the redundant memory cell selecting circuit according to the ninth embodiment. Each of the selecting fuse circuit blocks has a function of cancelling an address once stored. Except for the selecting fuse circuit blocks, the entire arrangement of the redundant memory cell selecting circuit according to the ninth embodiment is similar to the redundant memory cell selecting circuit of the first conventional example shown in FIG. 21.

FIG. 16 shows: address signals A0 to A8 and /A0 to /A8; fuses F00 to F11 and F120; signals /RA, N121 to N123, R00, and AALL; a power voltage VCC; a grounding voltage VSS; N-channel MOS transistors QN00 to QN11 and QN121; and P-channel MOS transistors QP00 and QP121. The signal AALL is the signal of which logical voltage becomes "H" when the address signals A0 to A8 are determined.

To store the address of a defective memory cell group to be relieved by a redundant memory cell group, the ninth embodiment is arranged similar to the first conventional example. Such that those six fuses out of the twelve fuses F00 to F11 in the selecting fuse circuit block, as shown in FIG. 16 which correspond to the selected address, are disconnected. To cancel the address once stored in the selecting fuse circuit block, the fuse F120 may be disconnected.

The redundant memory cell selecting circuit according to the ninth embodiment is characterized by comprising the selecting fuse circuit blocks having a function of cancelling an address once stored. Accordingly, if the redundant memory cell group is replaced with a defective memory cell group, the address of the defective memory cell group stored in the selecting fuse circuit block can be cancelled, and the address of the defective memory cell group is newly stored in another selecting fuse circuit block, so that the defective memory cell group can be replaced with another redundant memory cell group. This greatly improves the efficiency by which the redundant memory cell groups can relieve another memory cell group.

(Tenth Embodiment)

Figure 17:
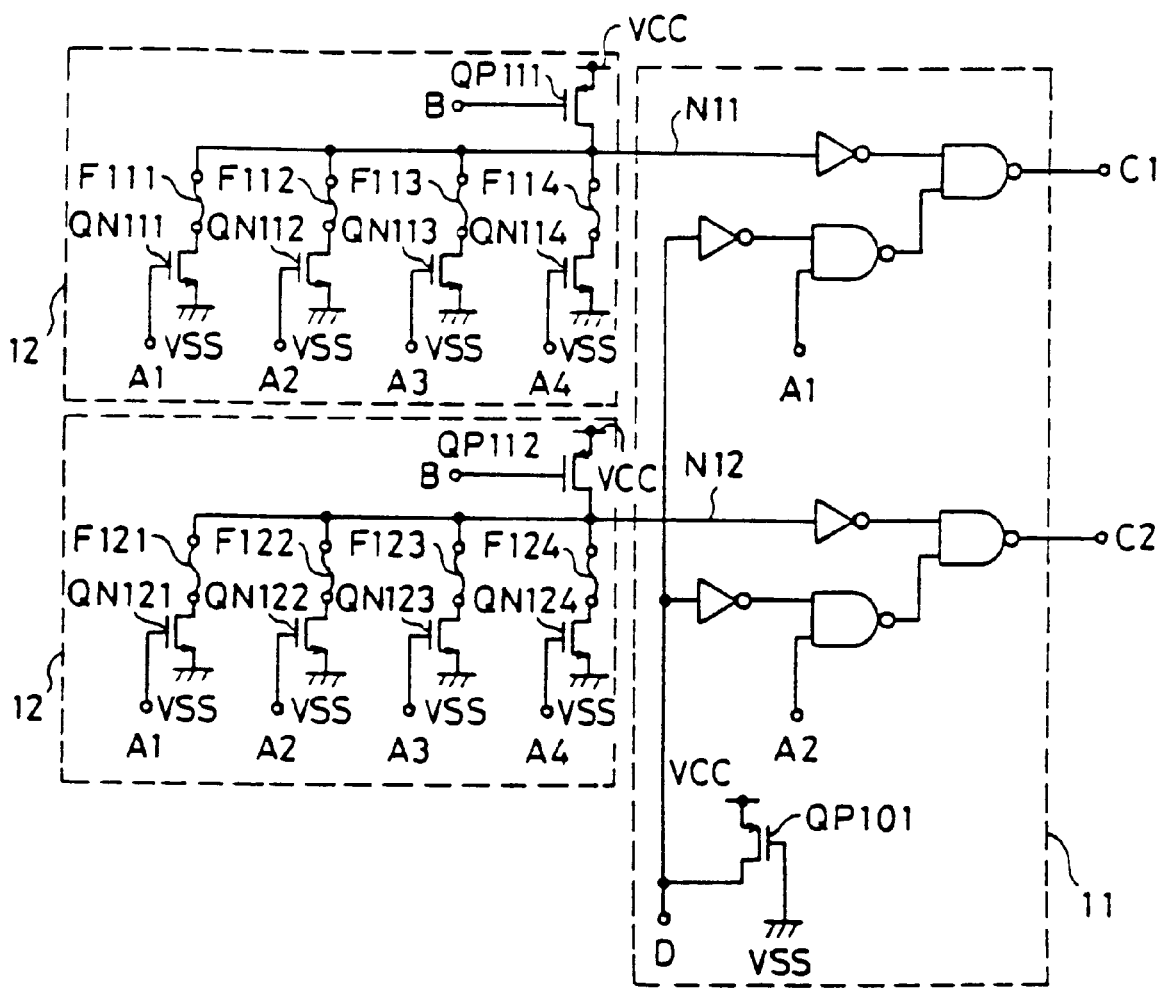
FIG. 17 is a circuit diagram of a redundant memory cell testing circuit block in the redundant memory cell selecting circuit according to a tenth embodiment of the present invention.

The following description will discuss the redundant memory cell selecting circuit according to a tenth embodiment of the present invention with reference to FIG. 17.

FIG. 17 shows a redundant memory cell testing circuit block incorporated in the redundant memory cell selecting circuit according to the tenth embodiment.

FIG. 17 shows: address signals A1 to A4 serving as redundant memory cell selecting input signals; a control signal B; redundant memory cell selecting output signals C1 and C2; a redundant memory cell testing control signal D; redundant memory cell selecting fuses F111 to F114, and F121 to F124; P-channel MOS transistors QP101, QP111, and QP112; N-channel MOS transistors QN111 to QN114 and QN121 to QN124; a redundant memory cell testing circuit block 11; selecting fuse circuit blocks 12; nodes N11 and N12; a power voltage VCC, and a grounding voltage VSS.

The redundant memory cell selecting circuit according to the tenth embodiment has one redundant memory cell testing circuit block 11 and first and second selecting fuse circuit blocks 12.

In the first selecting fuse circuit block 12, between the node N11 and the terminal disposed for the grounding voltage VSS, the fuse F111 is connected in series to the N-channel MOS transistor QN111; the fuse F112 is connected in series to the N-channel MOS transistor QN112; the fuse F113 is connected in series to the N-channel MOS transistor QN113; and the fuse F114 is connected in series to the N-channel MOS transistor QN114. The fuses F111, F112, F113, F114 are connected to one another by the node N11.

Furthermore, the address signal A1 is entered into the gate of the N-channel MOS transistor QN111; the address signal A2 is entered into the gate of the N-channel MOS transistor QN112; the address signal A3 is entered into the gate of the N-channel MOS transistor QN113; and the address signal A4 is entered into the gate of the N-channel MOS transistor QN114. Finally, the P-channel MOS transistor QP111 is connected between the node N11 and the terminal disposed for the power voltage VCC, and the control signal B is entered into the gate of the P-channel MOS transistor QP111.

Likewise, the second selecting fuse circuit block 12 is arranged such that between the node N12 and the terminal disposed for the grounding voltage VSS, the fuse F121 is connected in series to the N-channel MOS transistor QN121. Furthermore, the fuse F122 is connected in series to the N-channel MOS transistor QN122; the fuse F123 is connected in series to the N-channel MOS transistor QN123; the fuse F124 is connected in series to the N-channel MOS transistor QN124; and the fuses F121, F122, F123, F124 are connected to one another by the node N12.

Moreover, the address signal A1 is entered into the gate of the N-channel MOS transistor QN121; the address signal A2 is entered into the gate of the N-channel MOS transistor QN122; the address signal A3 is entered into the gate of the N-channel MOS transistor QN123; and the address signal A4 is entered into the gate of the N-channel MOS transistor QN124. The P-channel MOS transistor QP112 is connected between the node N12 and the terminal disposed for the power voltage VCC, and the control signal B is entered into the gate of the P-channel MOS transistor QP112.

In the redundant memory cell testing circuit block 11, the P-channel MOS transistor QP101 is connected between the terminal disposed for the redundant memory cell testing control signal D and the terminal is disposed for the power voltage VCC. The grounding voltage VSS is entered into the gate of the P-channel MOS transistor QP101. As the redundant memory cell selecting output signal C1, there is supplied a negation signal of the logical multiplication of a negation signal of the node N11, logical multiplication of the address signal A1, and redundant memory cell testing control signal D. As the redundant memory cell selecting output signal C2, there is supplied a negation signal of the logical multiplication of a negation signal of the node N12 and a negation signal of the logical multiplication of the address signal A2 and the redundant memory cell testing control signal D.

In the tenth embodiment, the redundant memory cell selecting circuit can select two redundant memory cell groups. The redundant memory cell testing circuit block 11 supplies two redundant memory cell selecting output signals C1, C2. When each of the logical voltages of the redundant memory cell selecting output signals C1, C2 is "L", the normal memory cell group is selected. When each of the logical voltages of the redundant memory cell selecting output signals C1, C2 is "H", the redundant memory cell group connected to the redundant memory cell selecting output signals C1, C2 is selected.

The following description will discuss the operation of the redundant memory cell selecting circuit according to the tenth embodiment.

First, the description will discuss the normal operation of the redundant memory cell selecting circuit.

Generally, an external terminal is disposed for the redundant memory cell testing control signal ID, where this external terminal is floating. Accordingly, by the P-channel MOS transistor QP101 having a gate into which the grounding voltage VSS is entered, the voltage of the redundant memory cell testing control signal D is equal to the power voltage VCC and the logic thereof is therefore "H".

Since the logical voltage of the redundant memory cell testing control signal D is "H", signals having the same logical voltages as those of the nodes N11, N12, are respectively supplied to the terminals disposed for the redundant memory cell selecting output signals C1, C2.

With the logical voltage of the redundant memory cell testing control signal D being "H" at the node, the logical voltage of the control signal B is set to "L" as the initial state. Accordingly, the P-channel MOS transistors QP111, QP112 are turned on and the logical voltage of the P-channel MOS transistors QP111, QP112 become "H" at the drains thereof.

The logical voltage of only an address signal selected from the address signals A1 to A4 becomes "H", and the logical voltage of the control signal B becomes "H". When provision is made such that the capacities of the P-channel MOS transistors QP111, QP112 are greater than those of the N-channel MOS transistors QN111 to QN124, the address signals A1 to A4 are arranged such that the logical voltages of the nodes N11, N12 become "H".

Under the circumstances above, when the fuses corresponding to a selected address signal are not disconnected, the logical voltages of the P-channel MOS transistors QP111, QP112 become "H" at the drains or nodes N11, N12, and the logical voltages of the redundant memory cell selecting output signals C1, C2 become "L", so that the normal memory cell group is selected. On the other hand, when the fuses corresponding to a selected address signal are disconnected, the logical voltage at the drain of the P-channel MOS transistor QP111 or QP112 becomes "H", and the logical voltage of the redundant memory cell selecting output signal C1 or C2 becomes "H", so that the redundant memory cell group is selected.

Thus, a normal or redundant memory cell group can be selected by a selected address signal.

The following description will discuss the operation of the redundant memory cell selecting circuit when a redundant memory cell group is to be selected without fuses of the selecting fuse circuit block disconnected.

In this case, the logical voltage of the redundant memory cell testing control signal D is made "L", and the logical voltage of the address signal A1 or A2 is made "H". Accordingly, the logical voltage of the redundant memory cell selecting output signals C1 or C2 becomes "H", so that the redundant memory cell group is selected.

Thus, when the logical voltage of the redundant memory cell testing control signal 0 is made "L" and the logical voltage of the address signal A1 is made "H", the logical voltage of the redundant memory cell selecting output signal C1 becomes "H", so that a redundant memory cell group selected by the redundant memory cell selecting output signal C1 can be tested. When the logical voltage of the redundant memory cell testing control signal D is made "L" and the logical voltage of the address signal A2 is made "H", the logical voltage of the redundant memory cell selecting output signal C2 becomes "H", so that the redundant memory cell group selected by the redundant memory cell selecting output signal C2 can be tested.

In the redundant memory cell selecting circuit according to the tenth embodiment having the above-mentioned arrangement, a redundant memory cell group can be selected regardless of whether the fuses F111 to F124 are connected or disconnected. More specifically, when the logical voltage of the redundant memory cell testing control signal D is made "L" and the address signal A1 or A2 is selected, a redundant memory cell group can be selected without disconnecting the fuses in the selecting fuse circuit block, and, thus, the redundant memory cell group selected can be checked for operation. An external control terminal is disposed for the redundant memory cell testing control signal D. By setting the logical voltage of the redundant memory cell testing control signal D at the time of a probe test conducted before assembling a memory device, each redundant memory cell group can be tested.

(Eleventh Embodiment)

Figure 18:
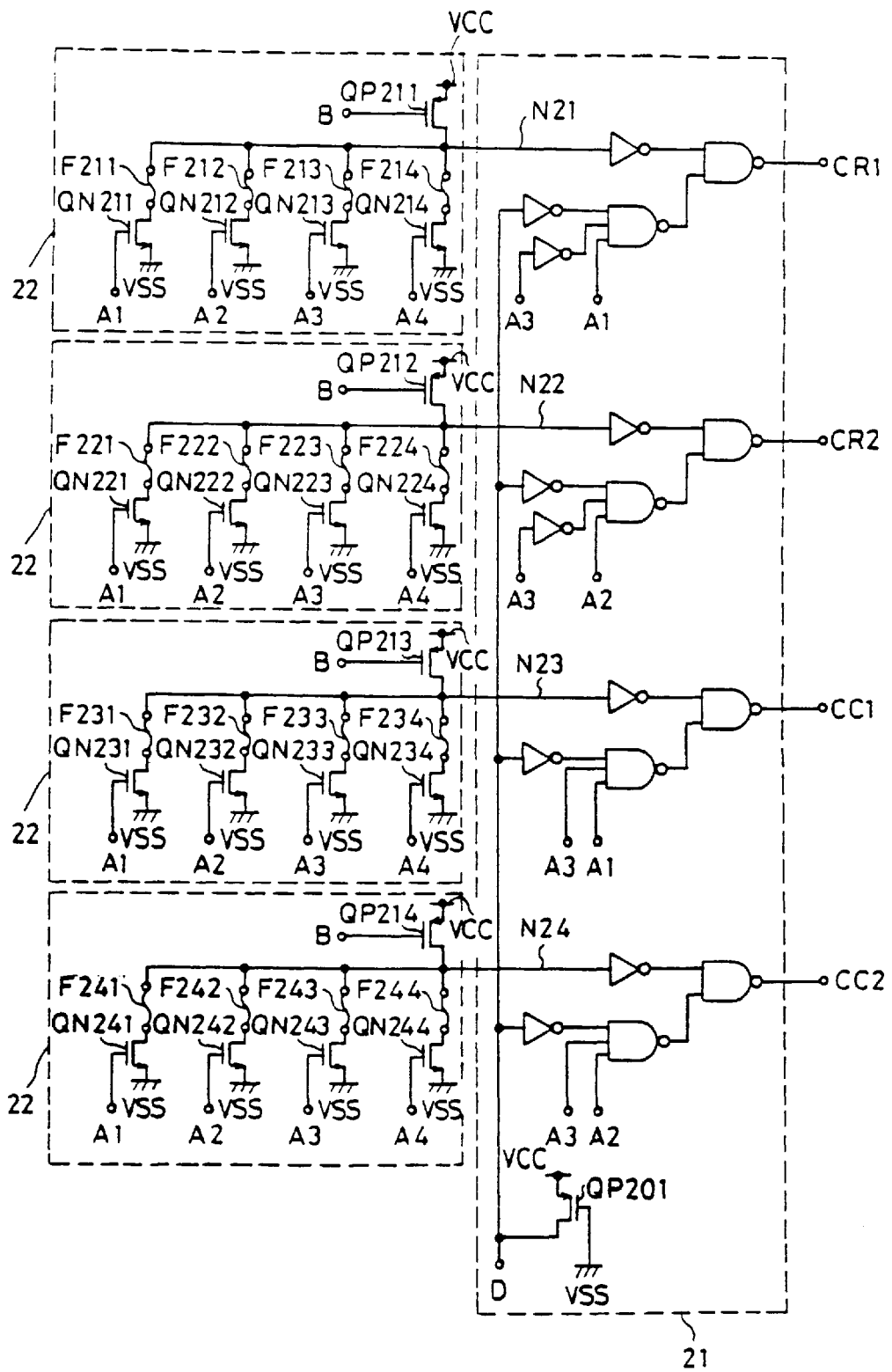
FIG. 18 is a circuit diagram of a redundant memory cell testing circuit block in the redundant memory cell selecting circuit according to an eleventh embodiment of the present invention.

The following description will discuss the redundant memory cell selecting circuit according to an eleventh embodiment of the present invention with reference to FIG. 18.

FIG. 18 shows a redundant memory cell testing circuit block incorporated in the redundant memory cell selecting circuit according to the eleventh embodiment.

FIG. 18 shows: address signals A1 to A4 serving as redundant memory cell selecting input signals; a control signal B; redundant memory cell selecting output signals CR1, CR2, CC1, and CC2; a redundant memory cell testing control signal D; redundant memory cell selecting fuses F211 to F214, F221 to F224, F231 to F234, and F241 to F244; P-channel MOS transistors QP201, and QP211 to QP214; N-channel MOS transistors QN211 to QN214, QN221 to QN224, QN231 to QN234, and QN241 to QN244; a redundant memory cell testing circuit block 21; selecting fuse circuit blocks 22; nodes N21 to N24; a power voltage VCC; and a grounding voltage VSS.

The redundant memory cell selecting circuit according to the eleventh embodiment has one redundant memory cell testing circuit block 21 and four selecting fuse circuit blocks 22.

In the first selecting fuse circuit block 22, between the node N21 and the terminal disposed for the grounding voltage VSS, the fuse F211 is connected in series to the N-channel MOS transistor QN211; the fuse F212 is connected in series to the N-channel MOS transistor QN212; the fuse F213 is connected in series to the N-channel MOS transistor QN213; the fuse F214 is connected in series to the N-channel MOS transistor QN214; and the fuses F211, F212, F213, F214 are connected to one another by the node N21.

The address signal A1 is entered into the gate of the N-channel MOS transistor QN211; the address signal A2 is entered into the gate of the N-channel MOS transistor QN212; the address signal A3 is entered into the gate of the N-channel MOS transistor QN213; and the address signal A4 is entered into the gate of the N-channel MOS transistor QN214. The P-channel MOS transistor QP211 is connected between the node N21 and the terminal disposed for the power voltage VCC, and the control signal B is entered into the gate of the P-channel MOS transistor QP211.

In the second selecting fuse circuit block 22, between the node N22 and the terminal disposed for the grounding voltage VSS, the fuse F221 is connected in series to the N-channel MOS transistor QN221; the fuse F222 is connected in series to the N-channel MOS transistor QN222; the fuse F223 is connected in series to the N-channel MOS transistor QN223; the fuse F224 is connected in series to the N-channel MOS transistor QN224; and the fuses F221, F222, F223, F224 are connected to one another by the node N22.

The address signal A1 is entered into the gate of the N-channel MOS transistor QN221; the address signal A2 is entered into the gate of the N-channel MOS transistor QN222; the address signal A3 is entered into the gate of the N-channel MOS transistor QN223; and the address signal A4 is entered into the gate of the N-channel MOS transistor QN224.

The P-channel MOS transistor QP212 is connected between the node N22 and the terminal disposed for the power voltage VCC. The control signal B is entered into the gate of the P-channel MOS transistor QP212.

In the third selecting fuse circuit block 22, between the node N23 and the terminal disposed for the grounding voltage VSS, the fuse F231 is connected in series to the N-channel MOS transistor QN231; the fuse F232 is connected in series to the N-channel MOS transistor QN232; the fuse F233 is connected in series to the N-channel MOS transistor QN233; the fuse F234 is connected in series to the N-channel MOS transistor QN234; and the fuses F231, F232, F233, F234 are connected to one another by the node N23.

The address signal A1 is entered into the gate of the N-channel MOS transistor QN231; the address signal A2 is entered into the gate of the N-channel MOS transistor QN232; the address signal A3 is entered into the gate of the N-channel MOS transistor QN233; and the address signal A4 is entered into the gate of the N-channel MOS transistor QN234. The P-channel PACS transistor QP213 is connected between the node N23 and the terminal disposed for the power voltage VCC, and the control signal B is entered into the gate of the P-channel MOS transistor QP213.

In the fourth selecting fuse circuit block 22, between the node N24 and the terminal disposed for the grounding voltage VSS, the fuse F241 is connected in series to the N-channel MOS transistor QN241; the fuse F242 is connected in series to the N-channel MOS transistor QN242; the fuse F243 is connected in series to the N-channel MOS transistor QN243; the fuse F244 is connected in series to the N-channel MOS transistor QN244; and the fuses F241, F242, F243, F244 are connected to one another by the node N24.

The address signal A1 is entered into the gate of the N-channel MOS transistor QN241; the address signal A2 is entered into the gate of the N-channel MOS transistor QN242; the address signal A3 is entered into the gate of the N-channel MOS transistor QN243; and the address signal A4 is entered into the gate of the N-channel MOS transistor QN244.

The P-channel MOS transistor QP214 is connected between the node N24 and the terminal disposed for the power voltage VCC, and the control signal B is entered into the gate of the P-channel MOS transistor QP214.

In the redundant memory cell testing circuit block 21, the P-channel MOS transistor QP201 is connected between the terminal disposed for the redundant memory cell testing control signal D and the terminal disposed for the power voltage VCC. The grounding voltage VSS is entered into the gate of the P-channel MOS transistor QP201.

Under the row-directional redundant memory cell selecting output signal CR1, there is supplied a negation signal of the logical multiplication of a negation signal of the node N21 and a negation signal of the logical multiplication of a negation signal of the address signal A3, the address signal A1 and a negation signal of the redundant memory cell testing control signal D.

Under the row-directional redundant memory cell selecting output signal CR2, there is supplied a negation signal of the logical multiplication of a negation signal of the node N22 and a negation signal of the logical multiplication of a negation signal of the address signal A3, the address signal A2 and a negation signal of the redundant memory cell testing control signal D.

Under the line-directional redundant memory cell selecting output signal CC1, there is supplied a negation signal of the logical multiplication of a negation signal of the node N23 and a negation signal of the logical multiplication of the address signal A3, the address signal A1 and a negation signal of the redundant memory cell testing control signal D.

Under the line-directional redundant memory cell selecting output signal CCI, there is supplied a negation signal of the logical multiplication of a negation signal of the node N24 and a negation signal of the logical multiplication of the address signal A2, the address signal A3 and a negation signal of the redundant memory cell testing control signal D.

In the eleventh embodiment, the redundant memory cell selecting circuit has redundant memory cell groups in both row and line directions. An address signal entered into the redundant memory cell testing circuit block 21 determines whether row-directional redundant memory cell groups or line-directional redundant memory cell groups are to be selected. In this embodiment, the redundant memory cell selecting output signals CR1, CR2 are used to select, respectively, two redundant memory cell groups in the line direction. The redundant memory cell selecting output signals CC1, CC2 are used to select, respectively, two redundant memory cell groups in the line direction. When the logical voltage of each of the redundant memory cell selecting output signals CRI, CR2, CCI, CC2 is "L", the normal memory cell is selected, and when the logical voltage of each of the redundant memory cell selecting output signals CR1, CR2, CC1, CC2 is "H", the redundant memory cell connected to the transmission line transmitting the redundant memory cell selecting output signal is selected.

The following description will discuss the operation of the redundant memory cell selecting circuit according to the eleventh embodiment.

First, the description will discuss the normal operation of the redundant memory cell selecting circuit.

Normally, the terminal disposed for the redundant memory cell testing control signal D is floating. Under such a state, the P-channel MOS transistor QP201 is turned on, so that the logical voltage of the redundant memory cell testing control signal D becomes "H" at the node. Accordingly, supplied to the terminals disposed for the redundant memory cell selecting output signals CR1, CR2, CC1, CC2 are signals of which logical voltages are the same as those at the nodes N21, N22, N23, N24, respectively.

As the initial state, the logical voltage of the control signal B is made "L", so that the P-channel MOS transistors QP211 to QP214 are turned on. That is, the logical voltages of the P-channel MOS transistors QP211 to QP214 become "H" at the drains thereof. Here, the logical voltages of only address signals selected from the address signals A1 to A4 become "H".

Under the circumstances above, when fuses corresponding to a selected address signals are not disconnected, the logical voltages of the P-channel MOS transistors QP211 to QP214 become "L" at the drains thereof and the logical voltages of the redundant memory cell selecting output signals CR1, CR2, CC1, CC2 become "H", so that the normal memory cell group is selected.

On the other hand, when fuses corresponding to a selected address signal are disconnected, the logical voltage of the P-channel MOS transistor QP211, QP212, QP213 or QP214 becomes "H" at the drain thereof and the logical voltage of the redundant memory cell selecting output signal CR1, CR2, CC1 or CC2 becomes "H", so that the redundant memory cell group is selected.

Thus, a normal memory cell group or a redundant memory cell group can be selected according to a selected address signal.

The following description will discuss the operation of the redundant memory cell selecting circuit when selecting a redundant memory cell group without fuses in the selecting fuse circuit block is disconnected.

In this case, the logical voltage of the redundant memory cell testing control signal D is made "L". The logical voltage of the address signal A1 or A2 is made "H" and the logical voltage of the address signal A3 is made "H" or "L". Accordingly, the logical voltage of the redundant memory cell selecting output signal CR1, CR2, M or CC2 becomes "H", so that the redundant memory cell group is selected. When the logical voltage of the address signal A3 is "L", two redundant memory cell groups in the row direction can be selected, and when the logical voltage of the address signal A3 is "H", two redundant memory cell groups in the line direction can be selected. Thus, a redundant memory cell group can be selected regardless of whether the fuses F211 to F214, F221 to F224, F231 to F234, and F241 to F244 are connected or disconnected.

In the redundant memory cell selecting circuit according to the eleventh embodiment having the above-mentioned arrangement, the logical voltage of the redundant memory cell testing control signal D is made "L" and the logical voltage of address signals are made "H" or "L". Accordingly, redundant memory cell groups in the row or line direction can be selected and checked for operation, without disconnecting fuses in a selecting fuse circuit block. An external control terminal may be disposed for the redundant memory cell testing control signal D. The redundant memory cell groups can be checked with the use of the external control terminal at the time of a probe test conducted before assembling a memory device.

(Twelfth Embodiment)

Figure 19:
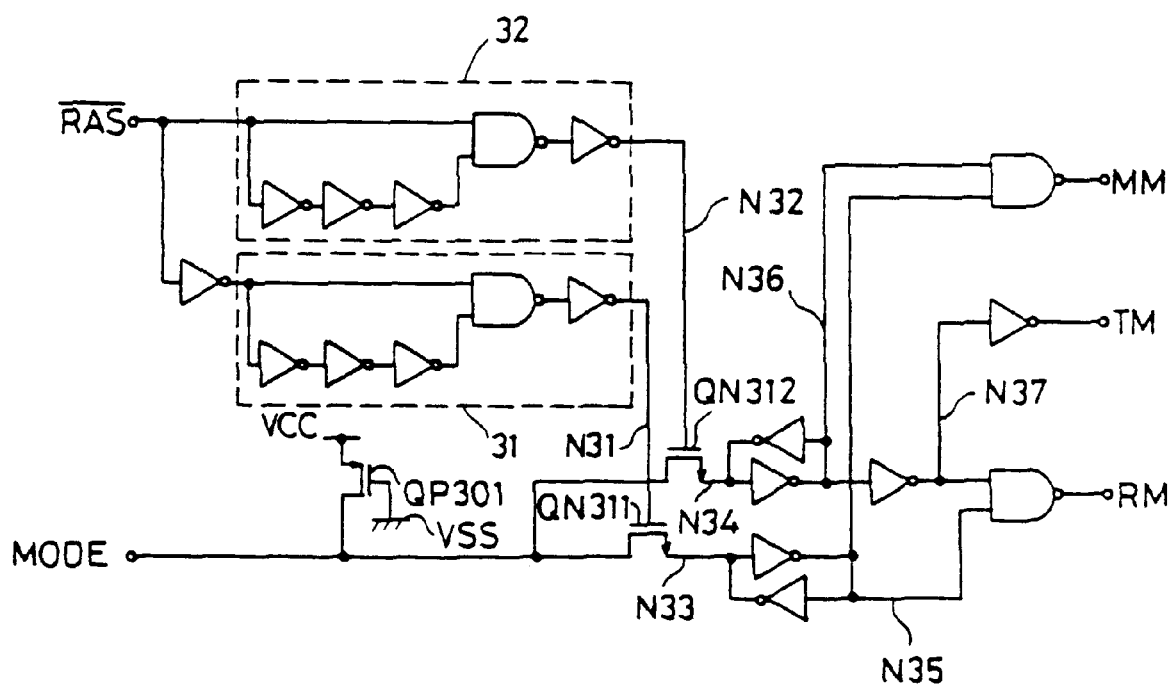
FIG. 19 is a circuit diagram of a testing control signal generating circuit block in the redundant memory cell selecting circuit according to a twelfth embodiment of the present invention.
Figure 20:
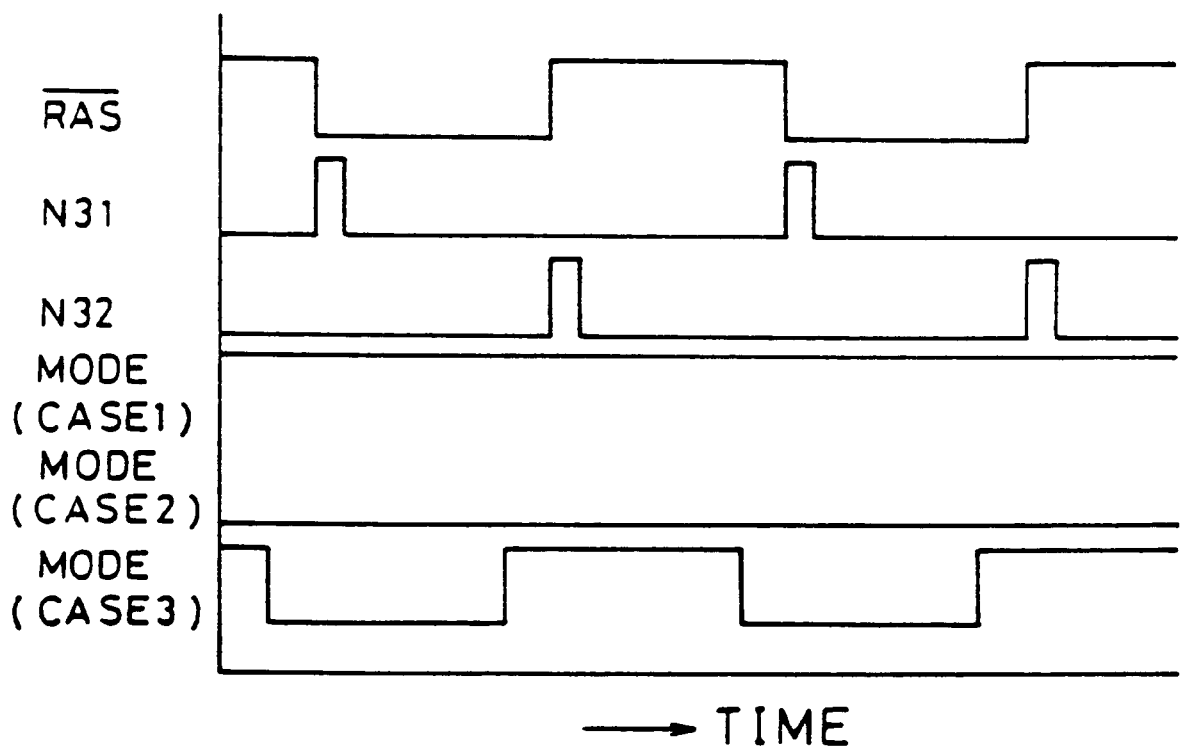
FIG. 20 is a view of signal waveforms illustrating the operation of the testing control signal generating circuit block in the redundant memory cell selecting circuit according to the twelfth embodiment of the present invention.

The following description will discuss the redundant memory cell selecting circuit according to a twelfth embodiment of the present invention with reference to FIGS. 19 and 20.

FIG. 19 shows a testing control signal generating circuit block incorporated in the redundant memory cell selecting circuit according to the twelfth embodiment. FIG. 20 shows signal waveforms illustrating the operation of the testing control signal generating circuit block.

FIGS. 19 and 20 show: an external input signal /RAS; a mode switching control signal MODE; mode control signals MM, TM, RM; nodes N31 to N37; a P-channel MOS transistor QP301; N-channel MOS transistors QN3111 and QN312; signal transition detecting circuits 31 and 32; a power voltage VCC; and a grounding voltage VSS.

When the logical voltage of each of the mode control signals MM, TM, RM is "L", the corresponding mode is designed to be selected. The mode control signal MM selects a mono-mode in which an input/output signal has one bit, the mode control signal TM selects a tetra-mode in which an input/output signal has four bits, and the mode control signal RM selects a redundant memory cell test mode and is used as a redundant memory cell testing control signal.

In the testing control signal generating circuit block shown in FIG. 19, a negation signal of the external input signal /RAS is entered into the signal transition detecting circuit 31, and an output signal of the signal transition detecting circuit 31 is supplied to the node N31. The external input signal /RAS is entered into the signal transition detecting circuit 32, and an output signal of the signal transition detecting circuit 32 is supplied to the node N32. The signal transition detecting circuits 31, 32 are designed to supply the logical multiplications of the in-out signals and signals which are delayed from the input signals and of which logical voltages are reverse to those of the input signals.

The P-channel MOS transistor QP301 is connected between the terminal disposed for the mode switching control signal MODE and the terminal disposed for the power voltage VCC, and the grounding voltage VSS is entered into the gate of the P-channel MOS transistor QP301.

The N-channel MOS transistor QN311 is connected between the terminal disposed for the mode switching control signal MODE and the node N33, and the gate of the N-channel MOS transistor QN311 is connected to the node N31. The N-channel MOS transistor QN312 is connected between the terminal disposed for the mode switching control signal MODE and the node N34, and the gate of the N-channel MOS transistor QN312 is connected to the node N32. A negation signal of the node N33 is supplied to the node N35; a negation signal of the node N35 is supplied to the node N33; a negation signal of the node N34 is supplied to the node N36; a negation signal of the node N36 is supplied to the node N34; and a negation signal of the node N36 is supplied to the node N37. A negation signal of the logical multiplication of the logical voltage of the node N35 and the logical voltage of the node N36 is supplied to the terminal disposed for the mode control signal MM; a negation signal of the logical multiplication of the logical voltage of the node N35 and the logical voltage of the node N37 is supplied to the terminal disposed for the mode control signal RM; and a negation signal of the node N37 is supplied to the terminal disposed for the mode control signal TM.

At the point where the external input signal /RAS falls down, the signal transition detecting circuit 31 is designed to generate and supply to the node N31 a pulse signal of which logical voltage is "H". At the point where the external input signal /RAS rises up, the signal transition detecting circuit 32 is designed to generate and supply to the node N32 a pulse signal of which logical voltage is "H". Through the pulse signals of which logical voltages are "H" and which are supplied to the nodes N31, N32, the mode switching control signal MODE is transmitted to the nodes N33, N34 through the N-channel MOS transistors QN311, QN312.

FIG. 20 shows signal waveforms illustrating the operation of the testing control signal generating circuit block. As shown in FIG. 20, CASE1 presents that the logical voltage of the mode switching control signal MODE is always "H", and CASE2 presents that the logical voltage of the mode switching control signal MODE is always "L". CASE3 presents that, at the point where the external input signal /RAS falls down from "H" to "L", the logical voltage of the mode switching control signal MODE is "L", and at the point where the external input signal /RAS rises up from "L" to "H", the logical voltage of the mode switching control signal MODE is "H".

In the CASE1, the logical voltage of the mode switching control signal MODE is maintained as "H", and the logical voltages of the mode control signals MM, TM, RM become "H", "L", "H", respectively, so that there is provided a normal memory cell test mode in a tetra-mode in which an input/output signal has four bits.

In the CASE2, the logical voltage of the mode switching control signal MODE is maintained as "L", and the logical voltages of the mode control signals MM, TM, RM become "H", "L", "H", respectively. Also, there is provided a normal memory cell test mode in a mono-mode in which an input/output signal has one bit.

In the CASE3, at the point where the external input signal /RAS falls down, the logical voltage of the mode switching control signal MODE becomes "L", and at the point where the external input signal /RAS rises up, the logical voltage of the mode switching control signal MODE becomes "H", and the logical voltages of the mode control signals MM, TM, RM become "H", "L", "L", respectively. Also, there is provided a redundant memory cell test mode in a tetra-mode in which an input/output signal has four bits.

The redundant memory cell selecting circuit according to the twelfth embodiment uses the testing control signal generating circuit block shown in FIG. 19 in the redundant memory cell selecting circuit according to each of the tenth and eleventh embodiments. In the twelfth embodiment, the mode control signal RM is designed to be entered, as the redundant memory cell testing control signal D, into the redundant memory cell testing circuit block in each of the tenth and eleventh embodiments.

As discussed in the foregoing, the redundant memory cell selecting circuit according to the twelfth embodiment is arranged such that the three modes, i.e., the normal memory cell test mode in the tetra-mode, the normal memory cell test mode in the mono-mode and the redundant memory cell test mode in the tetra-mode, can be switched from one another according to the input timings of the mode switching control signal MODE and the external input signal /RAS.

More specifically, the three modes can be switched with a single mode switching control signal and all the redundant memory cell groups can be tested with the reduced number of external control terminals. It is noted that one external control terminal including a protective circuit requires a chip area of about 20,000 $\mu m^2$. Further, as the number of the external control terminals is increased, the cost of the probe testing device increases. Thus, according to the redundant memory cell selecting circuit of the twelfth embodiment in which the three modes can be switched with a single mode switching control signal, the chip area of the memory device and the cost of the probe testing device can be effectively reduced.

What is claimed is:

1. A redundant memory cell selecting circuit comprising:
   a plurality of memory cell groups;
   a plurality of redundant memory cell groups; and
   a selecting fuse circuit block operative for storing any of a plurality of memory cell group selecting addresses respectively corresponding to said plurality of memory cell groups and operative for replacing the memory cell group corresponding to said memory cell group selecting address thus stored, with any of said plurality of redundant memory cell groups,
   said selecting fuse circuit block being operative for cancelling said stored memory cell group selecting address.

2. A redundant memory cell selecting circuit comprising:
   a plurality of redundant memory cell groups;
   a plurality of selecting fuse circuit blocks in the same number as that of said plurality of redundant memory cell groups; and
   a redundant memory cell testing circuit block connected to each of said plurality of selecting fuse circuit blocks;
   said redundant memory cell testing circuit block being operative for receiving a plurality of output signals of said plurality of selecting fuse circuit blocks, a plurality of address signals and a redundant memory cell testing control signal, and operative for supplying a plurality of redundant memory cell selecting output signals respectively corresponding to said plurality of redundant memory cell groups,
   said plurality of address signals being operative for causing each of said plurality of redundant memory cell selecting output signals to be put in a true state when said redundant memory cell testing control signal is put in a true state, and
   each of said plurality of redundant memory cell groups being operative for being selected when the redundant memory cell selecting output signal corresponding to said each of said plurality of redundant memory cell groups is put in said true state.

3. A redundant memory cell selecting circuit according to claim 2, wherein said plurality of redundant memory cell groups comprise:
   a first redundant memory cell group unit including a plurality of first redundant memory cell groups arranged in a line direction; and
   a second redundant memory cell group unit including a plurality of second redundant memory cell groups arranged in a row direction
   said first redundant memory cell group unit or said second redundant memory cell group unit being operative for being selected by said plurality of address signals.

4. A redundant memory cell selecting circuit according to claim 2, further comprising:

a testing control signal generating circuit block;

said testing control signal generating circuit block being operative for receiving an external input signal and a mode switching control signal, and operative for supplying a plurality of mode control signals and a redundant memory cell testing control signal, said redundant memory cell testing control signal being operative for being put in a true state by a combination of the logical voltage of said mode switching control signal at the point where said external input signal rises up, with the logical voltage of said mode switching control signal at the point where said external input signal falls down.

5. A redundant memory cell selecting circuit comprising:

a plurality of memory cell blocks, each of which includes a plurality of memory cell groups and a plurality of redundant memory call groups;

a first selecting fuse circuit block including fuses for selecting memory cell blocks; and a second selecting fuse circuit block including fuses for selecting memory cell blocks and fuses for selecting redundant memory cell groups, wherein one of said redundant memory cell groups in each of said memory cell blocks corresponds to said first selecting fuse circuit block, said first selecting fuse circuit block is coupled to each of said memory cell blocks, selects one of said memory call blocks, and replaces one of said memory cell groups in the thus selected memory cell block with said one redundant memory cell group corresponding to said first selecting fuse circuit block in the selected memory cell block, and said second selecting fuse circuit block is coupled to each of said memory cell blocks, selects one of said memory cell blocks, selects one of said redundant memory cell groups in the thus selected memory cell block, and replaces one of said memory cell groups in the thus selected memory cell block with the thus selected redundant memory cell group.

6. A redundant memory cell selecting circuit comprising:

a plurality of memory cell blocks, each of which includes a plurality of memory cell groups and a plurality of redundant memory call groups; and a selecting fuse circuit block including fuses for selecting memory cell blocks and fuses for selecting memory cell groups, wherein one of said redundant memory cell groups in each of said memory cell blocks corresponds to said selecting fuse circuit block, and said selecting fuse circuit block is coupled to each of said memory cell blocks, selects one of said memory cell blocks, selects one of said memory cell groups in the thus selected memory cell bock, and replaces the thus selected memory cell group with said one redundant memory cell group corresponding to the thus selected fuse circuit block in the thus selected memory cell block.

7. A redundant memory cell selecting circuit comprising:

a plurality of first memory cell blocks each of which includes a memory cell group;

a second memory cell block including a memory cell group; and a selecting fuse circuit block, said selecting fuse circuit block being operative for at least one of replacement of any of said plurality of first memory cell blocks with said second memory cell block, and replacement of the memory cell group in any of said plurality of first memory cell blocks with the memory cell group in said second memory cell block.

8. A redundant memory cell selecting circuit comprising:

a plurality of memory cell blocks, each of which includes a memory cell group and a redundant memory cell group; and a selecting fuse circuit block;

said selecting fuse circuit block being operative for replacing the memory cell group in a memory cell block out of said plurality of memory cell blocks, with the redundant memory cell group in a memory cell block out of other memory cell blocks than said first-mentioned memory cell block containing said first-mentioned memory cell group.

9. A redundant memory cell selecting circuit according to claim 7, wherein said second memory cell block includes a redundant memory cell group as the memory cell group; and said selecting fuse circuit block is operative for replacing the memory cell group in any of said plurality of first memory cell blocks, with said redundant memory cell group in said second memory cell block.

10. A redundant memory cell selecting circuit according to claim 7, wherein said selecting fuse circuit block is operative for replacing any of said plurality of first memory cell blocks, with said second memory cell block.

11. A redundant memory cell selecting circuit according to claim 6, wherein each of the plurality of memory cell blocks includes M redundant memory cell groups (M is a natural number), the selecting fuse circuit block is used as a first selecting fuse circuit block, second, third, . . . , M-1th, Mth selecting fuse circuit blocks are further disposed, the total number of said first, second, third, . . . , M-1th, Mth selecting fuse circuit blocks is equal to L (L is a natural number), an Nth selecting fuse circuit block (N is a natural number equal to or greater than 2 and equal to and smaller than M) which is each of said first, second, third . . . , M-1th, Mth selecting fuse circuit blocks, selects one of N redundant memory cell groups which belong to said M redundant memory cell groups in one of said memory cell blocks and which corresponds to said Nth selecting fuse circuit block, and the number of said Nth selecting fuse circuit blocks is K which is a natural number and which satisfies the following equation:

$$[[\{L \times (M-N+1)\}/M]-1 < K \leq \{L \times (M-N+)\}/M]K \leq \{L \times (M-N+)\}/M.$$

12. A redundant memory cell selecting circuit according to claim 7, further comprising a second selecting fuse circuit block, wherein each of said first and second memory cell blocks further includes a redundant memory cell group, and said second selecting fuse circuit block is operative for replacing the memory cell group in a memory cell block out of said first and second memory cell blocks, with said redundant memory cell group in said memory cell block.

13. A redundant memory cell selecting circuit according to claim 7, further comprising a second selecting fuse circuit block, said second selecting fuse circuit block being operative for selecting, as a redundant memory cell group, the memory cell group in any of said first memory cell blocks which is replaced with said second memory cell block.

14. A redundant memory cell selecting circuit according to claim 10, wherein each of the plurality of first memory cell blocks further has a bit line and a word line, and provision is made such that the bit line and the word line of any of said first memory cell blocks which is replaced with the second memory cell block, present the same potential.

* * * * *

UNITED STATES PATENT AND TRADEMARK OFFICE
CERTIFICATE OF CORRECTION

PATENT NO. : 5,953,264
DATED : September 14, 1999
INVENTOR(S) : Hiroshige Hirano, et. al.

It is certified that error appears in the above-identified patent and that said Letters Patent is hereby corrected as shown below:

Title page, item [73], Assignee: add --Matsushita Electronics Corporation--.

Signed and Sealed this

Sixth Day of June, 2000

Attest:

Attesting Officer

Q. TODD DICKINSON

Director of Patents and Trademarks